United States Patent
Lam et al.

(10) Patent No.: US 9,881,817 B1
(45) Date of Patent: Jan. 30, 2018

(54) PRECISION SUBSTRATE MATERIAL MULTI-PROCESSING USING MINIATURE-COLUMN CHARGED PARTICLE BEAM ARRAYS

(71) Applicant: Multibeam Corporation, Santa Clara, CA (US)

(72) Inventors: David K. Lam, Saratoga, CA (US); Kevin M. Monahan, Cupertino, CA (US); Michael C. Smayling, Fremont, CA (US); Theodore A. Prescop, San Jose, CA (US)

( * ) Notice: Subject to any disclaimer, the term of this patent is extended or adjusted under 35 U.S.C. 154(b) by 0 days.

(21) Appl. No.: 15/171,922

(22) Filed: Jun. 2, 2016

(51) Int. Cl.
| | |
|---|---|
| *G01R 31/26* | (2014.01) |
| *H01L 21/67* | (2006.01) |
| *H01L 21/265* | (2006.01) |
| *H01L 21/02* | (2006.01) |
| *H01L 21/285* | (2006.01) |
| *H01L 21/3065* | (2006.01) |

(Continued)

(52) U.S. Cl.
CPC ........ *H01L 21/67069* (2013.01); *H01J 37/26* (2013.01); *H01J 37/305* (2013.01); *H01J 37/3171* (2013.01); *H01L 21/0228* (2013.01); *H01L 21/0262* (2013.01); *H01L 21/26513* (2013.01); *H01L 21/28556* (2013.01); *H01L 21/3065* (2013.01); *H01L 21/31116* (2013.01); *H01L 21/31138* (2013.01); *H01L 21/32136* (2013.01); *H01L 21/67288* (2013.01); *H01L 22/12* (2013.01)

(58) Field of Classification Search
CPC B23K 17/00; B23K 2203/30; B23K 2203/42; B23K 2203/50; B23K 2203/52; B23K 26/032; B23K 26/0624; B23K 26/083; B23K 26/1224; B23K 26/1429; B23K 26/362; B23K 26/40; B23K 26/402; B23K 28/02

See application file for complete search history.

(56) References Cited

U.S. PATENT DOCUMENTS

| | | |
|---|---|---|
| 6,355,994 B1 | 3/2002 | Andeen |
| 6,617,587 B2 | 9/2003 | Parker |

(Continued)

OTHER PUBLICATIONS

U.S. Appl. No. 14/966,165, Multibeam Corporation.

(Continued)

*Primary Examiner* — Robert Bachner
(74) *Attorney, Agent, or Firm* — Carrington, Coleman, Sloman & Blumenthal, L.L.P.; Seth A. Horwitz

(57) ABSTRACT

Methods, tools and systems for patterning of substrates using charged particle beams without photomasks, without a resist layer, using multiple different processes (different chemistry processes and/or different ones of material deposition, removal and/or modification) in the same vacuum space, wherein said processes are performed independently (without cross-interference) and simultaneously. As a result, the number of process steps can be reduced and some lithography steps can be eliminated, reducing manufacturing cycle time and increasing yield by lowering the probability of defect introduction. Also, because such processes are resist-less, layer-to-layer registration and other column control processes can be performed by imaging previous-layer features local to (or in contact with) features to be written in a next layer as designated by the design layout database.

29 Claims, 27 Drawing Sheets

(51) Int. Cl.
*H01L 21/311* (2006.01)
*H01L 21/3213* (2006.01)
*H01L 21/66* (2006.01)
*H01J 37/317* (2006.01)
*H01J 37/305* (2006.01)
*H01J 37/26* (2006.01)

(56) References Cited

U.S. PATENT DOCUMENTS

| | | | |
|---|---|---|---|
| 6,734,428 B2 | 5/2004 | Parker |
| 6,738,506 B2 | 5/2004 | Miller |
| 6,777,675 B2 | 8/2004 | Parker |
| 6,844,550 B1 | 1/2005 | Yin |
| 6,872,958 B2 | 3/2005 | Andeen |
| 6,943,351 B2 | 9/2005 | Parker |
| 6,977,375 B2 | 12/2005 | Yin |
| 7,122,795 B2 | 10/2006 | Parker |
| 7,227,142 B2 | 6/2007 | Parker |
| 7,238,294 B2 | 7/2007 | Koops |
| 7,378,003 B2 | 5/2008 | Athas |
| 7,435,956 B2 | 10/2008 | Parker |
| 7,456,402 B2 | 11/2008 | Parker |
| 7,462,848 B2 | 12/2008 | Parker |
| 7,786,454 B2 | 8/2010 | Parker |
| 7,928,404 B2 | 4/2011 | Parker |
| 7,941,237 B2 | 5/2011 | Parker |
| 8,242,457 B2 | 8/2012 | Parker |
| 8,384,048 B2 | 2/2013 | Wiesner |
| 8,999,627 B1 | 4/2015 | Lam |
| 8,999,628 B1 | 4/2015 | Lam |
| 9,184,027 B1 | 11/2015 | Lam |
| 9,207,539 B1 | 12/2015 | Lam |
| 9,453,281 B1 | 9/2016 | Prescop |
| 9,466,463 B1 | 10/2016 | Lam |
| 9,466,464 B1 | 10/2016 | Lam |
| 9,478,395 B1 | 10/2016 | Monahan |
| 9,556,521 B1 | 1/2017 | Prescop |
| 9,595,419 B1 | 3/2017 | Monahan |
| 9,620,332 B1 | 4/2017 | Lam |
| 9,673,114 B1 | 6/2017 | Lam |
| 2011/0309553 A1* | 12/2011 | Huff | B23K 17/00 |
| | | | 264/400 |

OTHER PUBLICATIONS

U.S. Appl. No. 14/980,884, Multibeam Corporation.
Cornelius Thiele, et al., "Electron-beam-induced direct etching of graphene", Carbon, vol. 64, 84 (2013).
Ivo Utke, et al., "Gas-assisted focused electron beam and ion beam processing and fabrication", J. Vac. Sci. Technol. B 26, 1197 (2008).
D. Roediger, et al., "Focused electron beam induced etching of silicon using chlorine", Nanotechnology 21 285306 (2010).
H. Henry Yue, et al., "Plasma etching endpoint detection using multiple wavelengths for small open-area wafers", J. Vac. Sci. Technol. A 19, 66 (2001).
Muhammad Khan, et al., "Damascene Process and Chemical Mechanical Planarization", http://www.ece.umd.edu/class/enee416/GroupActivities/Damascene%20Presentation.pdf (accessed Jun. 9, 2015).
Michael Huth, et al., "Focused electron beam induced deposition: A perspective", Beilstein J. Nanotechnol., Aug. 2012, 3, 597-619.
N. Chekurov, et al., "Dry fabrication of microdevices by the combination of focused ion beam and cryogenic deep reactive ion etching", J. Micromech. Microeng. 20, 085009 (2010).
Riika Puurunen, "Surface chemistry of atomic layer deposition: a case study for the trimethylaluminum/water process", J. App. Phys. 97, 121301 (2005).
Steven M. George, "Atomic Layer Deposition: An Overview", Chem. Rev. (2010), 110(1), 111-31.
I.P. Jain, et al., "Ion beam induced surface and interface engineering", Surface Sci. Rep. 66 (2011), 77-172.
O.D Roshchupkina et al., "Focused ion beam induced structural modifications in thin magnetic films", J. App. Phys. 112, 033901 (2012).
Yutaka Yamada, et al., "Tuning Surface Wettability at the Submicron-Scale: Effect of Focused Ion Beam Irradiation on a Self-Assembled Monolayer", J. Phys. Chem. C (1212015), DOI: 10.1021/acs.jpcc.5b09019.

* cited by examiner

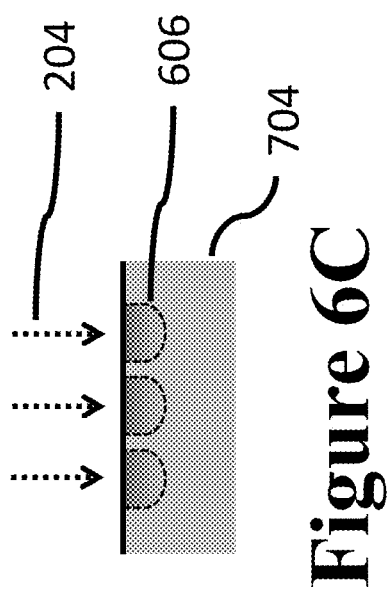
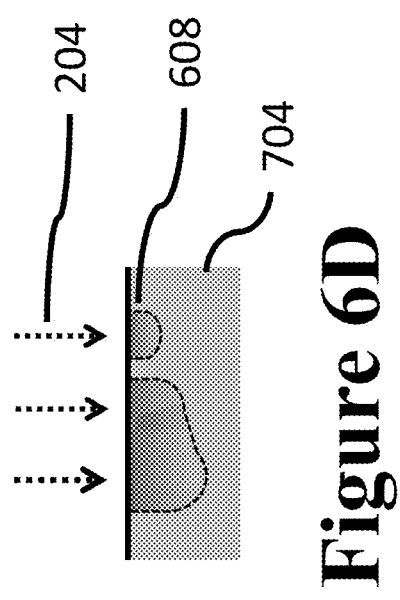

PRECISION SUBSTRATE MATERIAL MULTI-PROCESSING USING MINIATURE-COLUMN CHARGED PARTICLE BEAM ARRAYS

BACKGROUND

The present application relates to systems, devices and methods for maskless substrate material deposition, removal and modification using charged particle beams; and more particularly to directly and precisely manufacturing patterned substrates as defined in a design layout database using multiple, matched charged particle beams, with the assistance of gas and/or photon injection, and/or of gas and/or photon process control, metrology and endpoint detection, such that multiple different processes using multiple different chemistries can be performed independently and simultaneously in the same vacuum space.

Note that the points discussed below may reflect the hindsight gained from the disclosed inventions, and are not necessarily admitted to be prior art.

FIG. 2A shows an example of a wafer 200 being scanned by multiple charged particle beams 204 emitted by respective miniature electrostatically-deflected beam columns 206. Individual columns 206 are able to target a portion of the substrate surface 706, called herein a "writing area" 202, with their respectively emitted beams 204.

FIG. 2B shows an example of a wafer 200. Example die 208 size and column 206 center-to-center spacing 210 (column separation) are shown. A regular grid of columns 206 (schematically indicated in FIG. 2B via their center positions, represented here as plusses) can use different spacing 210 in different (generally, orthogonal) directions. Die 208 size and column separation 210 are not required to (and generally, will not) correspond. Column separation 210 generally corresponds to the "writing area" 202 of corresponding columns 206. A column's 206 "writing area" 202 is defined as the substrate area 202 targetable by a charged particle beam 204 emitted from the column 206, taking into account stage 404 movement.

The multiple column 206 array 402 comprises miniature (small enough to fit multiple columns 206 in an array 402) charged particle beam columns 206 arranged in a regular grid. For example, column 206 arrays with center-to-center column spacing 210 of 30 mm×30 mm have been implemented, though other column spacings 210 (e.g., 24 mm×33 mm) can also be used.

A stripe is the portion of the wafer 200 surface that a charged particle beam can target while the stage 404 is moving predominantly in a single direction, i.e., before the stage 404 moves laterally and switches predominant directions to give the beam access to a different stripe. A "frame" 710 is defined herein as the portion of the wafer 200 (or other substrate 704) surface that a beam 204 can target at a given time, corresponding to the main-field deflection area 710 at that time, as designated by the design layout database. A frame 710 is typically designated to be rectangular, for convenience (e.g., to tile the writing area 202); and smaller than the furthest extent to which the beam 204 can be deflected (e.g., to preserve beam 204 targeting accuracy).

"1-D" refers to 1-D gridded design rule. In a 1-D layout, optical pattern design is restricted to lines running in a single direction, with features perpendicular to the 1-D optical design formed in a complementary lithography step known as "cutting". The complementary step can be performed using a charged particle beam lithography tool comprising an array of columns 206—for example, electrostatically-controlled miniature electron beam columns 206. A 1-D layout is separated in the design layout database into a "line pattern" and a "cut pattern". The design layout database contains the information needed by lithography tools to pattern one or more layers on a substrate 704. A line pattern generally comprises an array of unidirectional lines. Cut patterns generally comprise line-cuts and holes.

Generally, line patterns are written by an optical lithography system, which can be followed by other process steps to increase the density of lines on the substrate 704. Cut patterns are written by a complementary (generally higher-resolution) process, such as electron beam lithography. Use of electron beam lithography for this complementary process is also called complementary e-beam lithography, or CEBL. The combination of the line-forming process followed by line-cuts written with CEBL to pattern a substrate layer is called complementary lithography.

FIG. 2C shows an example of a prior art process for removing material from a substrate surface 706.

Typically, as shown in FIG. 2C, a design layout database is accessed 212 to designate where substrate surface 706 material should be removed (e.g., to form new pattern or repair previously-formed pattern). One or more optical masks are fabricated based on the design layout database 214 using a mask making tool 216. Fabrication of a set of optical masks for one microchip design typically takes weeks and costs millions of dollars at advanced process nodes.

A hard mask is blanket deposited on the substrate surface 706 in step 218 by a deposition tool 220, and a photoresist layer is blanket deposited on the substrate surface 706 in step 222 by a resist deposition tool 224.

"Blanket" deposition and etch generally refers to deposition and etch on the entire surface 706 of the substrate 704.

"Resist" refers herein to a class of materials used in substrate lithography. When a resist is deposited on a substrate 704 and exposed to an energy source corresponding to the type of resist (e.g., photons for a photoresist) in a chosen pattern, its chemical properties change such that when the resist is developed (in ways similar to developing a photographic film), a portion of the resist corresponding to a positive or negative image of the pattern (depending on the type of resist) will remain, allowing the pattern to be expressed in the material underlying the resist, e.g., using etch steps.

The photoresist is then exposed using the optical mask(s) 226 by an optical lithography tool 228. The exposed portion of the resist layer (as designated by the optical mask(s)) is removed 230 using a resist developing tool 232, and the resulting patterned resist layer is inspected for defects and process control metrology (After Develop Inspection (ADI) and metrology) 234 by an inspection tool 236. Yield-reducing errors can be reduced by other tools, adding additional steps, and potentially additional defects.

The hard mask is then blanket etched through the pattern expressed in the resist layer 238, by an etch tool 240, to express (substantially) the same pattern in the hard mask layer. The resist layer is then removed 242 by a resist removal tool 244, and the material underlying the hard mask is blanket etched through the pattern expressed in the hard mask 246, using an etch tool 248 (e.g., a reactive-ion etch or ion milling tool, generally the same type of tool as etch tool 240), to express (substantially) the same pattern in the underlying material.

FIG. 2D shows an example of a prior art process for depositing material onto a substrate surface 706.

Typically, as shown in FIG. 2D, a design layout database is used to designate 212 where on a substrate surface 706 material should be deposited (e.g., to form new pattern or repair previously-formed pattern). One or more optical masks are fabricated based on the design layout database 214 using a mask making tool 216.

A pattern material is blanket deposited 250 and a hard mask is blanket deposited 218 on the substrate surface by a deposition tool 220. A photoresist layer is blanket deposited on the substrate surface 706 in step 222 by a resist deposition tool 224. The photoresist is then exposed using the optical mask(s) 226 by an optical lithography tool 228. The exposed portion of the resist layer (as designated by the optical mask(s)) is removed 230 using a resist developing tool 232, and the resulting patterned resist layer is inspected for defects and process control metrology (After Develop Inspection (ADI) and metrology) 234 by an inspection tool 236.

The hard mask is then blanket etched through the pattern expressed in the resist layer 238 by an etch tool 240 to express (substantially) the same pattern in the hard mask layer. The resist layer is then removed 242 by a resist removal tool 244, and the material underlying the hard mask is blanket etched through the pattern expressed in the hard mask 246, using an etch tool 248, to express (substantially) the same pattern in the underlying (pattern) material (added in step 250). The hard mask is then removed 252 using a hard mask removal tool 254.

FIG. 2E shows an example of a prior art process for modifying material on (or in) a substrate 704 using ion implantation.

Typically, as shown in FIG. 2C, a design layout database is used to designate 212 where on a substrate 704 material should be modified (e.g., to form transistor active areas through ion implantation). One or more optical masks are fabricated based on the design layout database 214 using a mask making tool 216.

A photoresist layer is blanket deposited on the substrate surface 706 in step 222 by a resist deposition tool 224. The photoresist is then exposed using the optical mask(s) 226 by an optical lithography tool 228. The exposed portion of the resist layer (as designated by the optical mask(s)) is removed 230 using a resist developing tool 232, and the resulting patterned resist layer is inspected for defects and process control metrology (After Develop Inspection (ADI) and metrology) 234 by an inspection tool 236.

The substrate surface 706 is then blanket modified 256 (using ion implantation), through the pattern expressed in the resist layer by steps 226 and 230, using an ion implantation tool 258 to express (substantially) the same pattern in the underlying material. The resist layer is then removed 242 by a resist removal tool 244.

Typically, functional substrate devices are built using a combination of material removal, deposition and modification processes.

FIG. 2F shows an example of a prior art process for etching differentiated-profile structures that are then uniformly filled. Etch structures can be manufactured to one depth using a mask set in an iteration of the steps shown in FIG. 2C; additional etch structures can be manufactured to different depths using additional mask sets (typically, a mask set per depth) using additional iterations of the FIG. 2C steps. Once the desired etch structures have been manufactured, one or more desired fill materials are blanket deposited 250 and the substrate surface 706 undergoes chemical mechanical planarization 256 (in a chemical mechanical planarization tool).

FIG. 2G shows an example of a prior art process for etching differentiated-profile structures that are then differently filled. As in the process shown in FIG. 2F, differentiated-profile etch structures can be manufactured using multiple masks in multiple iterations of the steps shown in FIG. 2C. Etch structures can then be differently filled using multiple masks in multiple iterations of the steps shown in FIG. 2D.

Process iterations required by the prior art processes shown in and described with respect to FIGS. 2F and 2G add concomitant overhead and defect susceptibility per iteration, corresponding to, for example, tool process cycles and tool transfers.

$T_i$ represents the amount of time added by a corresponding process step. $Y_i$ represents the yield impact of a corresponding process step (one minus probability of introducing one or more yield-reducing defects). Where T is the total time taken by one or more material deposition, removal or modification processes, and Y is the expected yield following such material processes:

$$T = \sum_{i=1}^{N} T_i \qquad \text{Equation 1:}$$

$$Y = \prod_{i=1}^{N} Y_i \qquad \text{Equation 2:}$$

Numerous steps in conventional semiconductor lithography material deposition, removal and modification processes are expensive and time consuming, and potentially introduce defects into the desired pattern, lowering yield. Process-induced defects can be introduced by, for example, wafer handling, resist spin and heating, lithography, resist development, etch, deposition, inspection, implantation, thermal processing, and chemical-mechanical polishing.

SUMMARY

The present application discloses new approaches to systems, devices and methods for precision material processing on or in a substrate 704 using multiple miniature charged particle beam columns 206 variously configurable to directly deposit material onto or remove material from the substrate surface 706, or to modify substrate surface 706 materials, without a resist layer and without cross-interference between different processes performed in the same vacuum space.

In particular, the inventors have discovered that multiple arrays 402 of miniature electrostatically-deflected charged particle beam columns 206, configurable with various local gas and photon injectors and detectors 102, 104, 106, 108 local to corresponding individual columns 206 that limit effects and signals to the respective individual frames 710 scanned by said corresponding individual columns 706, can be configured (using said local injectors and detectors 102, 104, 106, 108) to perform multiple different types of substrate processing on a substrate 704 independently and simultaneously within the same vacuum space. Substrate manufacturing processes performable without cross-interference within the same vacuum space can include (in some embodiments, any or all of), for example, deposition (bulk or ALD), removal (bulk or ALE etching, or milling) and modification (ion implantation), despite significantly different chemistries of distinct processes. Inspection and other process (or other) metrology can also be performed within the same vacuum space without interference from material deposition, removal or modification processes performed by different columns 206.

Substrates 704 can be transferred from array 402 to array 402 of such multi-process cluster tools 500 (e.g., to access different column 206 configurations for different processes or combinations of processes) without breaking vacuum and without removing the substrate 704 from the stage 404. This enables significant reductions in yield-reducing process steps, as well as independent and simultaneous (intra-tool pipeline) processing of multiple substrates 704. In some embodiments multiple layers can be patterned without transitioning the substrate 704 between process tools.

The inventors have also discovered that resist-less deposition, removal and modification processes enable highly precise process control (including registration and critical dimension control) of beam columns 206 using imaging of features—including functional features (components in a finished device, such as circuit structures or other functional structures)—from previous process layers exposed on the substrate surface 706, without the signal degradation typically introduced by a blanket resist layer. Resist-less imaging operates synergistically with resist-less processing to reduce process cycle time and increase yield.

Preferably, the different patterning and inspection processes within a vacuum space are performed by charged particle beam columns 206 of substantially the same design, equipped with different local gas or photon injectors or detectors 102, 104, 106, 108 depending on the particular desired application(s).

Multi-process cluster tools 500 can perform complex multiple-process patterning with reduced tool transition requirements, reducing the number of process steps required to create pattern, reducing manufacturing time and increasing yield.

BRIEF DESCRIPTION OF THE DRAWINGS

The disclosed inventions will be described with reference to the accompanying drawings, which show important sample embodiments and which are incorporated in the specification hereof by reference, wherein:

FIG. 6C schematically shows an example of the results of a uniform-profile direct material modification process.

FIG. 6D schematically shows an example of the results of a differentiated-profile direct material modification process.

DETAILED DESCRIPTION OF SAMPLE EMBODIMENTS

Figure 1:
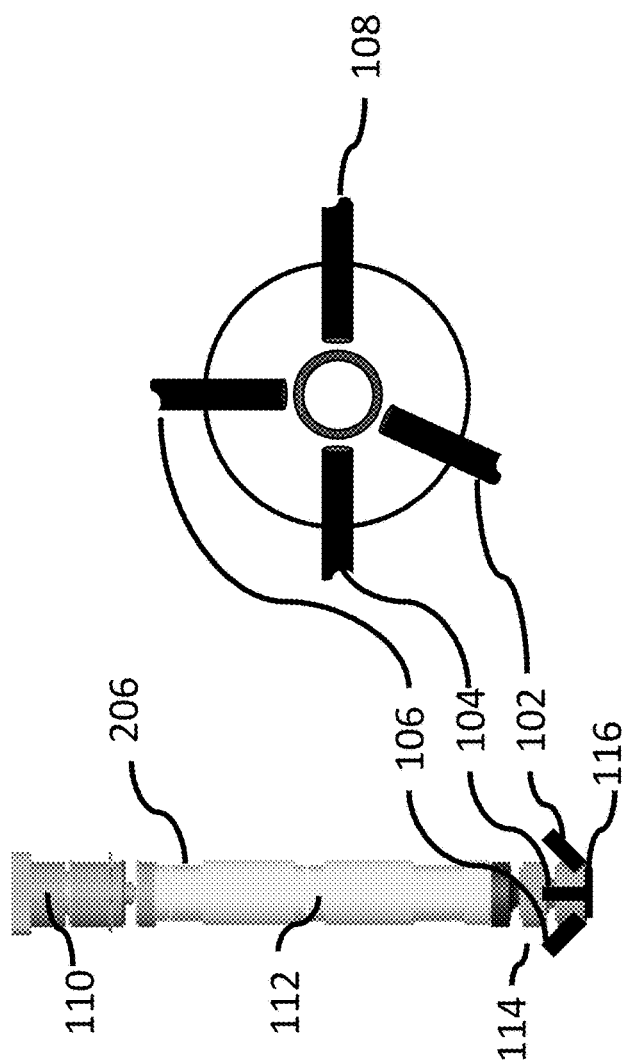
FIG. 1 schematically shows an example of a charged particle beam column.

The numerous innovative teachings of the present application will be described with particular reference to presently preferred embodiments (by way of example, and not of limitation). The present application describes several inventions, and none of the statements below should be taken as limiting the claims generally.

The present application discloses new approaches to systems, devices and methods for precision material processing on or in a substrate 704 using multiple miniature charged particle beam columns 206 variously configurable to directly deposit material onto or remove material from the substrate surface 706, or to modify substrate surface 706 materials, without a resist layer and without cross-interference between different processes performed in the same vacuum space.

In particular, the inventors have discovered that multiple arrays 402 of miniature electrostatically-deflected charged particle beam columns 206, configurable with various local gas and photon injectors and detectors 102, 104, 106, 108 local to corresponding individual columns 206 that limit effects and signals to the respective individual frames 710 scanned by said corresponding individual columns 706, can be configured (using said local injectors and detectors 102, 104, 106, 108) to perform multiple different types of substrate processing on a substrate independently and simultaneously within the same vacuum space. Substrate processes performable without cross-interference within the same vacuum space can include (in some embodiments, any or all of), for example, deposition (bulk or ALD), removal (bulk or ALE etching, or milling) and modification (ion implantation), despite significantly different chemistries of distinct processes. Inspection and other process (or other) metrology can also be performed within the same vacuum space without interference from material deposition, removal or modification processes performed by different columns 206.

Substrates 704 can be transferred from array 402 to array 402 of such multi-process cluster tools 500 (e.g., to access different column 206 configurations for different processes or combinations of processes) without breaking vacuum and without removing the substrate 704 from the stage 404. This enables significant reductions in yield-reducing process steps, as well as independent and simultaneous (intra-tool pipeline) processing of multiple substrates 704. In some embodiments multiple layers can be patterned without transitioning the substrate 704 between process tools.

The inventors have also discovered that resist-less deposition, removal and modification processes enable highly precise process control (including registration and critical dimension control) of beam columns 206 using imaging of features—including functional features (components in a finished device, such as circuit structures or other functional structures)—from previous process layers exposed on the substrate surface 706, without the signal degradation typically introduced by a blanket resist layer. Resist-less imaging operates synergistically with resist-less processing to reduce process cycle time and increase yield.

Preferably, the different patterning and inspection processes within a vacuum space are performed by charged particle beam columns 206 of substantially the same design, equipped with different local gas or photon injectors or detectors 102, 104, 106, 108 depending on the particular desired application(s).

Multi-process cluster tools 500 can perform complex multiple-process patterning with reduced tool transition requirements, reducing the number of process steps required to create pattern, reducing manufacturing time and increasing yield.

The disclosed innovations, in various embodiments, provide one or more of at least the following advantages. However, not all of these advantages result from every one of the innovations disclosed, and this list of advantages does not limit the various claimed inventions.

Enables charged particle beam-assisted material deposition, removal and modification, independently and simultaneously, in the same vacuum space;
enables rapidly and directly inspecting a pattern layer, immediately before, during or after a write cycle, without resist or other intervening material layer;
enables layer-to-layer registration and critical dimension control during writing and inspection based on imaging of features in previous layers without intervening resist or other material layer;
enables new design paradigms relating to, e.g., the ability to manufacture 3D structures using multiple different types and chemistries of processes in a single pass;
enables rapid device design prototyping, inspection and modification without tool transfer;
fewer stage transfers when patterning a substrate layer;
enables rapidly writing a pattern layer without photomasks;
enables rapidly writing a pattern layer without resist;
improves yield;
faster manufacturing of semiconductor and other substrate devices;
lower cost manufacturing of semiconductor and other substrate devices;
faster design to manufacturing process;
lower cost design to manufacturing process;
faster per-layer patterning cycle;
lower cost per-layer patterning cycle;
lower tool cost to pattern a substrate layer;
fewer tools required to pattern a substrate layer;
decreased chemical usage of reactive material deposition, removal and modification processes;
decreased environmental impact of reactive material deposition, removal and modification processes;
enables layer patterning, pattern inspection, defect identification and pattern repair without breaking vacuum; and
material deposition, removal and modification is LOCALIZED to material affected by charged particle beams.

Some exemplary parameters will be given to illustrate the relations between these and other parameters. However it will be understood by a person of ordinary skill in the art that these values are merely illustrative, and will be modified by scaling of further device generations, and will be further modified to adapt to different materials or architectures if used.

The present application is directed to, for example, factory-integrated use of systems comprising multiple miniature charged particle beam columns 206 to create nanometer-scale patterns on semiconductor wafers 200 or other substrates 704. Arrays of heavily configurable, miniature, electrostatically-controlled columns 206 can be used to pattern wafers 200 and other substrates 704 directly, without masks, without resist, and without previous lithographic steps. Differently configured columns 206 in the same or different arrays 402, in the same vacuum space, can be used to independently and simultaneously perform direct material addition, subtraction and modification without interfering with each other—including when different columns 206 or arrays 402 of columns 206 inject different gasses and/or different wavelength photons. Such systems can be used to achieve massively parallel substrate processing, reduce stage travel per layer (or other cycle measure) of processing, reduce tool transfer requirements and increase yield.

"Substrate" is defined herein as a workpiece having a composition and shape amenable to patterning and deposition of one or more layers of material thereupon using techniques applicable to semiconductor device fabrication, such that functional devices can be produced therefrom.

As used herein, "writing" a substrate 704 refers to any process which expresses specified pattern in or on the substrate 704 (including material deposited on the substrate surface 706), expressed through any physical or chemical property of said substrate 704 or deposited material. With respect to charged particle beams 204 targeted in direct dependence on a design layout database, "writing" includes, for example, "direct material subtraction", "direct material addition", "direct ALE" and "direct ALD", and "direct material modification".

Wafer or substrate "alignment" is defined herein as the action of positioning a substrate 704 with respect to the coordinate system of a process tool. Marks on the substrate that facilitate this process are called "alignment marks" or "alignment targets".

"Pattern registration" (or "registration") is defined herein as positioning a subsequent pattern on the substrate with respect to a previous pattern on the substrate. Marks on the substrate that facilitate this process are called "registration marks" or "registration targets". "Pattern overlay" is the measured error resulting from inaccuracy of the registration process.

Generally, registration errors increase as distance from alignment and registration targets increases, over time, and as beam deflections are performed. Improving locality (in space and time) of registration to active material processing and imaging locations tends to reduce accumulated registration drift, reduce pattern overlay errors and improve process and imaging fidelity, thereby improving yield.

The "design layout database" is the database specifying physical layout to be patterned on the substrate 704 (e.g., for electronic semiconductor devices, a database of electrical designs that have been rendered into physical layouts).

An individual pattern "layer", as used herein, generally corresponds to a single layer number in a GDSII file or similarly layout-specifying file.

"Direct material subtraction" is defined herein as removal of material from a substrate's surface 706 using one or more electrostatically-deflected charged particle beams 204 targeted in direct dependence on a design layout database; said removal localized to material directly affected by said beams 204, and comprising at least some intended (not incidental) removal of material immediately following said direct affect by said beams 204. Removed material can comprise, for example, pure and/or doped substrate 704 material, or material previously added onto or embedded into the substrate's surface 706.

"Direct material addition" is defined herein as deposition of material onto a substrate surface 706 using one or more electrostatically-deflected charged particle beams 204 targeted in direct dependence on a design layout database; said deposition comprising at least some deposition localized to material directly affected by said beams 204, and comprising at least some intended (not incidental) deposition of material immediately following said direct affect by said beams 204. Deposited material can comprise, for example, electrically conductive or other functional material, hard mask or other process-related material, or structural material.

"Direct material modification" is defined herein as modification of chemical or compositional properties of material on or in a substrate 704 using one or more electrostatically-deflected charged particle beams 204 targeted in direct dependence on a design layout database; said direct material modification comprising at least some such modification localized to material directly affected by said beams 204, and comprising at least some intended (not incidental) modification of material immediately following said direct affect by said beams 204. Modified material can comprise, for example, chemically, electrically, mechanically, thermally, optically, magnetically, fluidically, structurally or biologically functional material (such as semiconductor wafer 200 or other substrate 704 material, or materials that were deposited on said wafer 200 or other substrate 704), or hard mask, resist or other process-related material.

"Direct material processing" is defined herein as one or more of direct material addition, direct material subtraction, and direct material modification. "Multi-processing" is defined herein as two or more different direct material processes. A "multi-process cluster tool" is a cluster tool 500 (see FIG. 5A) configured to perform multi-processing (see, e.g., FIGS. 5B, 5C and 5D).

"Direct inspection" is defined herein as inspection of a substrate 704 using one or more electrostatically-deflected charged particle beams 204 targeted in direct dependence on a design layout database. Preferably, and except where stated herein, direct inspection of pattern written by a direct material process uses the same design layout database to target beams 204 as used by the direct material process to target beams 204; and columns 206 used by said direct inspection and said direct material process are matched (as defined below). Note that substrate alignment and registration, which use imaging and pattern-matching of targeted features to adjust beam deflection parameters to improve targeting fidelity, are applications of substrate inspection. As disclosed with respect to inventive embodiments herein, beam alignment, registration, critical dimension control and other charged particle beam 204 imaging-related process control and metrology preferably use direct inspection to image the substrate 704.

Preferably, the same columns 206 configured to perform one or more direct material processes can also perform direct inspection, enabling direct inspection to be performed on a substrate 704 immediately following—or even during—a direct material process, without breaking vacuum or removing the substrate 704 from the stage 404 between the direct inspection and the direct material process. Columns 206 and/or arrays 402 sharing the same beam system 400 or cluster tool 500 as columns 206 and/or arrays 402 configured to perform direct material processing can also be configured to specialize in direct inspection (enabling, e.g., direct inspection to identify defects and perform process monitoring). Direct inspection has significant synergy with direct material processes, as further discussed with respect to, e.g., FIGS. 5B, 5C and 5D.

Embodiments disclosed herein enable precision processing of materials and, in particular, direct material addition, subtraction and modification of materials common in the processing of semiconductor wafers 200 and other electrically, magnetically, optically, mechanically, chemically, or biologically active substrates 604. Such substrates 704 can comprise, for example, workpieces used in fabrication and repair of light emitting diodes (LEDs), giant magnetic resonance (GMR) structures used in thin-film heads, optoelectronic devices (OEDs) used for switching, micro-electro-mechanical systems (MEMS) structures, photonic metamaterials, and patterned substrates 704 used for chemical analysis and genetic sequencing.

Embodiments disclosed herein use "substantially the same" columns (as defined hereinbelow), configured with "local" (as defined hereinbelow) gas injectors 102, photon injectors 104, gas detectors 106 and photon detectors 108 to enable highly localized direct material addition, subtraction and modification, along with highly localized direct inspection and other metrology processes, to be performed independently and simultaneously in the same vacuum space.

Direct material addition, subtraction and modification processes can be performed either sequentially or simultaneously by multiple columns 206 in an array 402, and different columns 206 in an array 402 can be configured and/or optimized to perform the same or different material addition, subtraction or modification process(es) (or other processes, e.g., inspection and metrology).

In preferred embodiments, an array 402 of charged particle beam columns 206 is stationary, the stage holding the wafer 200 moves back and forth, and individual charged particle beam columns 206 move (deflect) the corresponding beam 204 across the wafer 200 to perform direct material processing.

Preferably, beam motion across the wafer 200 (or other substrate 704) comprises vector-raster scanning while writing on a substrate 704 (e.g., vector scanning to a registration mark, raster scanning the registration mark, and then vector scanning to write cut features) or vector-raster scanning while imaging a substrate 704 (e.g., vector scanning to a target feature or "care-area" containing a target feature, and raster scanning across the target feature). Preferably, each column 206 has its own local (short communication path) control computer. Vector-raster scanning, care-areas, and use of multiple control computers local to respective columns 206 are disclosed in U.S. patent application Ser. No. 14/085,768, which is incorporated herein by reference. (As will be apparent to one of ordinary skill in the arts of charged particle beam substrate processing, "care-areas" can be adapted for use as approximately minimally-sized regions containing target locations for irradiation for direct inspection and various direct material processes.) These control methodologies enable areas of interest to be irradiated, while efficiently avoiding areas where direct material processing or inspection (or other charged particle beam 204 function) is not required.

Rapid pattern alignment and registration with superior accuracy (e.g., for minimizing pattern overlay error) can be achieved using imaging targets generated using Hadamard and/or Walsh functions and distributed throughout process-critical portions of the substrate 704 (in some embodiments, other portions of the substrate as well) as disclosed in, for example, U.S. patent application Ser. No. 14/522,563, which is incorporated herein by reference.

High beam current can be maintained by reducing coulomb repulsion forces between electrons by (substantially) eliminating charged-particle crossovers in the columns 206.

The design layout database is preferably partitioned to designate which column 206 will perform the work for the corresponding substrate writing area 202. Preferably, writing areas 202 have the same size as column-to-column spacing 210.

In preferred embodiments, different columns 206 can perform direct material addition, subtraction or modification (and/or other processes, such as imaging, depending on configuration) on a patterned or unpatterned substrate 704 differently, substantially simultaneously (depending on, e.g., whether particular frames 710 correspond to features to be written during the current "pass", i.e., the current process iteration and/or the current iteration of the stage 404 moving past the array 402 of columns 206) and independently, with beam deflection parameters determining targeted beam landing position based directly (though generally not only; e.g., tool parameter settings are also typically used, and identified areas of interest can be considered, as mentioned above) on a previously-partitioned design layout database used by various column 206 functions. For example, the design layout database can be used to perform direct material processing as well as direct inspection and other metrology functions. Use of multiple columns 206 to independently and simultaneously write and/or image a substrate 704, both based directly on the same previously-partitioned design layout database, is disclosed in, for example, U.S. Pat. No. 8,999,627, which is incorporated herein by reference.

As used herein, sets of multiple beam columns 206 being "substantially the same" means that the sets of multiple beam columns 206 comprise arrays 402 of multiple miniature, electrostatically-driven columns 206 with identical column-to-column spacing 210, and identical type(s) of beam deflection (electrostatic) and focus mechanisms.

For stages, "substantially the same" means identical or nearly identical with respect to substrate-stage alignment mechanisms, stage positioning mechanisms, stage position accuracy, and control electronics and software. "Nearly" identical means that the variations can include, for example, year-to-year improvements in design or manufacturing techniques, or incremental improvements or optimizations to a design, which can result in two stages being "substantially the same" but not identical. However, major changes in design approach will break substantial sameness.

As used herein, "matched" columns 206 means that columns 206 are "substantially the same", and stages 404 are "substantially the same". Generally, different matched columns 206 are able to process corresponding different writing areas 202 of a substrate 704 similarly (preferably, nearly identically); and different arrays 402 of matched columns 206, irradiating different substrates 704 carried by different stages 404 that are substantially the same, are able to process the different substrates 704 similarly (preferably, nearly identically). Embodiments disclosed herein preferably use matched columns 206.

Fully automated beam 204 targeting based directly on a design layout database is preferred. Beam 204 targeting "based directly on (or in direct dependence on) a design layout database" is defined to mean that during patterning, local column controllers automatically access portions of the design layout database relevant to corresponding writing areas 202 and interpret the design layout database directly into beam column 206 control instructions for immediate use specifying beam deflection, beam dwell timing, beam blanking timing, beam shape and/or beam landing energy.

Columns 206 can be configured such that different columns 206 use different physical and chemical processes for highly localized removal, deposition or modification.

Beam column 206 parameters and other parameters can be independently and automatically optimized per-column 206 based on automatically analyzed images taken of direct material process results (addition, subtraction or modification). Automatic image analysis and column parameter optimization are disclosed in, for example, U.S. Pat. No. 8,999,628, which is incorporated herein by reference.

Preferably, there is minimal or no overlap between writing areas 202 of different columns 206.

One of ordinary skill in the arts of charged particle beam material processing will recognize that a wide variety of other control options are available per-column 206 and per-array 402.

Preferably, photon injectors 104 and detectors 108, and gas injectors 102 and detectors 106, as described below are "miniature"; that is, they are small enough to position (preferably, fixedly) at or near the bottom of a column 206 (preferably, attach to the column 206 and/or thread through its casing) whichever of said injectors and detectors 102, 104, 106, 108 are required by the embodiment, such that the injector or detector 102, 104, 106, 108 (and particularly the corresponding emitter or collector portion thereof) is located to permit function as described herein.

FIG. 1 schematically shows an example of a charged particle beam column 206 configured for material modification. Preferably, an array 1002 of such columns 206 (which can be individually customized to the particular processes to be respectively executed) is used to perform direct material addition, subtraction or modification as disclosed herein.

As used herein with respect to a gas or photon injector or detector 102, 104, 106, 108, "local" (also "Local" and "LOCAL") is defined as: mounted in a fixed position with respect to a corresponding one of multiple columns 206, the active emitting or collecting component(s) of said injector or detector 102, 104, 106, 108 having line of sight to and oriented towards the main-field deflection area 710, said active component(s) at least partially contained within the perimeter of the column 206.

An active emitting or collecting component(s) is the optical lens, gas inflow or outflow opening, or kinetic lens 702 that for the respective local injector or detector 102, 104, 106, 108 last emits gas particles or photons towards, or first collects gas particles or photons from, the corresponding main-field deflection area 710. Preferably, said active component(s) is as close as practical to the center of the column's 206 primary axis and to the substrate surface 706 without impacting the substrate surface 706, and without compromising column 206 function (e.g., electrical characteristics of the column 206) or the focus area of the active component(s). Greater proximity is preferred, for example, to preserve collimation or focus, and to enhance gas and photon collection effectiveness, selectivity and efficiency.

Except where stated otherwise, gas and photon injectors 102, 104 and detectors 106, 108 described with respect to the various embodiments disclosed herein are local. Direct material addition, subtraction and/or modification using multiple miniature charged particle beam columns 206 is enabled by the use of LOCAL gas and/or photon injectors and/or detectors 102, 104, 106, 108 as disclosed herein.

Use of local gas injectors 102 (preferably using injection in the molecular flow regime) and local photon injectors 104, with outputs limited to (e.g., focused on) the corresponding frame 710, restricts output gas and photons away from and prevents cross-effect on frames 710 of other columns 206 (which are preferably processed differently, such that different actions (including different direct material processes) can be performed independently and simultaneously by different columns 206 and corresponding local injectors 104, 106 and detectors 106, 108). Similarly, use of local gas detectors 106 and local photon detectors 108 focused on corresponding frames 710 limits detection (signal acquisition) to those corresponding frames 710, and restricts detection of (signal acquisition from) other frames 610 (i.e., enables a high degree of detector selectivity).

Use of local injectors 102, 104 and local detectors 106, 108 thus enables use of multiple—preferably, large arrays 402 (e.g., an array 402 of 88 columns processing a 300 mm wafer) of—columns 206 working independently and simultaneously without different columns 206 (and their local injectors 102, 104 and/or detectors 106, 108) in an array 1002 interfering with each other. Further, it enables use of multiple arrays 402 of columns 206 working independently and simultaneously within the same vacuum space without different arrays 402 interfering with each other; even though, in preferred embodiments, local gas injectors 102 in different arrays 402 (or different columns 206 within an array 1002) can inject different chemistries and/or local photon injectors 104 can inject different wavelengths onto corresponding frames 710.

Local gas injectors 102 and/or local photon injectors 104 can be used to greatly improve process control of and otherwise increase material deposition rates and yield rates of direct material addition processes; increase material removal rates and yield rates of charged particle beam etching and/or milling; and increase material modification rates and yield rates of ion implantation; in some embodiments, sufficiently to provide throughput compatible with in-line fabrication processes.

Local gas and photon detectors 106, 108 enable real time detection of spatially localized processes and process endpoints: generally, localized per-column 206 to individual frames 710.

With respect to direct material addition, features can be deposited to the correct height, neither shorter nor taller than desired. Further, narrow features can be deposited to the same (or different) height as wide features.

With respect to direct material subtraction, features can be etched or milled to the correct depth, neither deeper nor shallower than desired. Further, thin holes can be etched and/or milled to the same (or different) depth as a wide hole; or deep thin holes and shallow wide holes, or vice versa, or a combination thereof, can be etched and/or milled.

With respect to direct material modification, features can be modified to the correct geometries, e.g., neither shallower nor deeper than desired, with dopant concentrations distributed as desired.

As shown in FIG. 1, a general-purpose embodiment of a charged particle beam column 206 configured to perform direct material addition, direct material subtraction or direct material modification, or inspection and/or metrology processes comprises: a charged particle beam gun 110 (an ion gun or electron beam gun, respectively), including a charged particle source (an ion or electron source, respectively), aperture and electrostatic lens; a deflection assembly 112 for blanking the charged particle beam 204, deflecting the charged particle beam trajectory, and/or modifying the charged particle beam shape (blanking, deflecting or reshaping the ion or electron beam 204, respectively); a main lens 114, for focusing the charged particle beam (ion or electron beam 204) or adjusting the beam size at the substrate plane; one or more local gas injectors 102, for increasing partial pressure of process-critical gasses (e.g., gasses providing deposition precursors or ions for knock-on implantation), creating oxidizing or reducing environments, or for creating other or additional advantageous chemical environments within the main-field deflection area 710; one or more local photon injectors 104; a local gas detector 106; one or more local photon detectors 108; and an electron detector 116 (which can be located near the substrate 704 or inside the column 206), e.g., to detect secondary electrons or ions, and/or backscattered electrons or ions for, inspection, metrology, and localized process monitoring.

Some embodiments of charged particle beam columns 206, e.g., for certain ALE, ALD or inspection and/or metrology processes, do not comprise some or all of local gas injectors 102, local gas detectors 106, local photon injectors 104 and local photon detectors 108.

Preferably, columns 206 within a cluster tool 500 are substantially the same or matched, but can be individually configured with a selected combination of local injectors and/or detectors 102, 104, 106, 108 based on the intended application; with local gas and photon injectors 102, 104 configured to inject the same or different gas(ses) or wavelength(s), respectively, to create process environments that are selectable per column 206 (per frame 710). Individual configuration can be accomplished by, for example, attachment onto or interpenetratively through the column 206 body (without interfering with beam function), or onto a framework supporting the column array 402. A cluster tool 500 configured to perform two or more of direct material addition, subtraction and modification on a substrate, without breaking vacuum and without transfer between process tools, will comprise columns 206 with multiple distinct configurations—while the columns 206 themselves can be interchangeable parts. This confers a variety of advantages, including rapid tool configuration, repurposing and repair, and allows broad application flexibility.

A local gas injector 102 can be used to increase the partial pressure of process gasses within (a volume proximate to) a main-field deflection area 710 significantly (e.g., by multiple orders of magnitude) relative to the average ambient pressure in the vacuum chamber, while having minimal effect on process gas concentration at other main-field deflection areas 710 (corresponding to other columns 206). A kinetic lens 702 (further described below with respect to, e.g., FIGS. 7A, 7B, 7C, 7D and 7E) connected to a local gas injector 102 to collimate or focus the gas injector's 102 output on an area of the substrate surface containing the main-field deflection area 710 of a corresponding column 206 further significantly raises consistently achievable localized (to the volume near the frame 710) partial pressures (in some embodiments, by multiple orders of magnitude). These large increases over vacuum chamber ambient partial pressure of partial pressures of advantageous gasses in a main-field deflection area 710—resulting in large increases in partial pressure of such gasses at the corresponding charged particle beam 204 impact location—can significantly raise the direct material process rate (in some embodiments, by multiple orders of magnitude).

Generally, gas flow rate can be calculated ahead of time and depends on several parameters, including the particular process to be used (and its required and/or desired chemistry), local temperature (which can be controlled to be substantially constant, within an acceptable range depending on the particular process), the design layout database, and charged particle beam 204 current (which can be constant). If necessary, changes to gas flow parameters during a direct material process (addition, subtraction or modification) can be made based on feedback from local detectors (e.g., local gas detectors 106 or local photon detectors 108).

In a preferred embodiment, gas flow rate is kept above a predetermined threshold such that supply of process gasses is not limiting.

A local photon injector 104 is preferably a light source optically connected by an optical fiber to a lens.

Local photon injectors 104 emitting infrared (IR) photons can be used to precisely raise the temperature of the substrate 704 at the beam 204 impact location to optimize temperature conditions for the corresponding charged particle beam process (direct material process) without overheating the substrate 704 as a whole. This generally allows a higher temperature at the frame 710 than would be desirable (or otherwise practical) for the entire substrate 704, and allows IR photon flux to be maintained at levels that increase the rate of adsorption, but are below levels that induce spontaneous etching (in some embodiments, orders of magnitude greater IR photon flux than could desirably be obtained using blanket illumination).

Preferably, the lens focuses the IR photons on a minimal area containing the main-field deflection area 710. In some embodiments, temperature optimization can be used to increase substrate surface 706 material adsorption rate of process gasses (higher process-critical gas adsorption rate typically correlates to shorter cycle times for direct material processes using gas injection); or to modify resultant material surface properties (e.g., surface texture). In non-reactive embodiments, temperature changes can also affect material subtraction rate.

Using temperature measured within a known small area containing the beam 204 impact location (e.g., a minimal area containing the main-field deflection area 710), preferably using a local photon detector 108, temperature at the beam impact location can be approximated. In some embodiments (e.g., embodiments limited by substrate surface 706 adsorption rate of process-critical gasses), by optimizing said temperature conditions, direct material process cycle times can be significantly reduced.

Desired local temperatures for individual columns 206 can be determined prior to starting a direct material process, depending on, for example, the design layout database and characteristics of the particular process(es) to be used. Feedback from local temperature measurement can then be used to control brightness and other characteristics (e.g., pulse rate, pulse duration) of the photon injector 104 to precisely control the local temperature of the substrate 704.

Local photon injectors 104 can also be used to shine photons, with wavelength(s) appropriate to one or more substrate surface materials (or adsorbed process gasses), on the main-field deflection area 710 to modulate surface reaction rates. Some types of direct material processes can be accelerated by exciting substrate surface 706 material (or adsorbed process gas) electrons to a higher energy state. Photon energies can be matched to the bond energies of reactant species. For example, deep UV is characteristic for photochemistry of various materials. Local UV photon injectors can provide illumination intensity near a reaction site that is orders of magnitude greater than could be desirably (or otherwise practically) obtained by blanket illumination of the vacuum chamber surrounding a column array 402.

Figure 8:
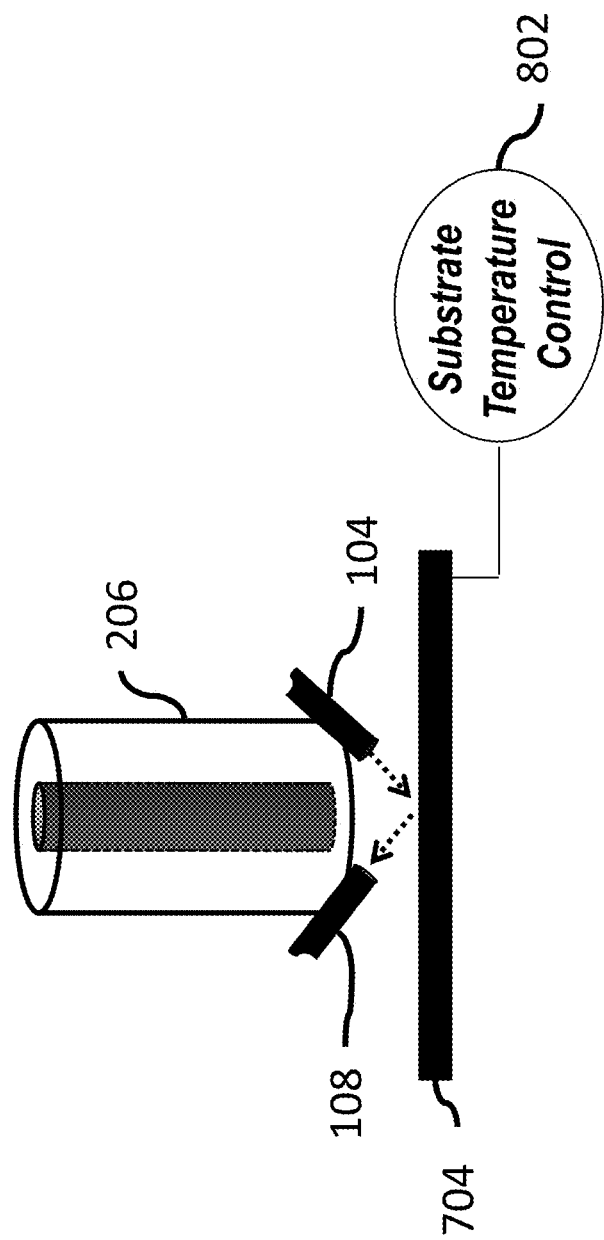
FIG. 8 schematically shows an example of a photon injector and a photon detector mounted on a charged particle beam column.

Local photon injectors 104 can also be used to shine photons on the substrate surface material to perform various analyses (process monitoring) of substrate surface material, e.g., polarimetry, reflectometry, interferometry. For example, the intensity of reflected injected photons depends on the thickness of the layer (the film) and its optical absorption properties in direct material addition and subtraction; and on changes in the optical constants of a material modified by ion implantation. Preferably, a local photon detector 108 is arranged to collect as many of the reflected photons as possible to optimize the efficacy of such analyses, as shown in FIG. 8. Such photons can generally be of any wavelength, within limits set by available optics and other physical properties.

Endpoint detection refers herein to using detectors to determine when a direct material process (e.g., etching or milling) has been completed for a particular frame 710 (e.g., when a desired etch/mill depth has been reached).

For example, in direct material subtraction (particularly bulk material subtraction, and in some embodiments ALE), as an ongoing material subtraction process reaches layer (or other) boundaries on the substrate surface 706, different materials (or different quantities or proportions of materials) are removed from the substrate surface 706, and different materials (or different quantities or proportions of materials) are exposed on the substrate surface 706. As a result, both substrate surface material(s), and material(s) removed from the substrate surface 706, will show measurably changing properties at or near layer (or other) boundaries. As another example, as an ongoing direct material modification process modifies bulk or surface substrate properties, the properties of the modified material increasingly influence measurements of substrate surface 706 properties. Substrate surface 706 material properties, and rates of change and higher-order derivatives of indicated properties, can be used to accurately determine and/or predict process endpoints.

Different embodiments can use different methods (gas, photon or electron detection, with analysis) of endpoint detection. Depending on the process, some methods of endpoint detection can be more sensitive than others. In some embodiments, use of multiple methods of endpoint detection improves endpoint detection accuracy.

Process monitoring refers herein to analysis of detected material properties to determine process accuracy and/or produce process performance metrics. Process monitoring can be used to provide process feedback (e.g., to local control computers) that enables process adjustments (e.g., etch, mill or beam parameter adjustments, process gas flow, or automatic design layout database modification). Process feedback can occur during, and/or resulting process adjustments can be made for, the frame 710 in which corresponding photons or gas particles were collected, or one or more subsequent frames 710, or one or more subsequent processing cycles (e.g., for a subsequent layer, or for a subsequent substrate).

Local gas detectors 106, using secondary ion mass spectrometry, can be used for process monitoring, e.g., to monitor process reaction rates or localized gas composition.

In direct material subtraction (particularly bulk material subtraction), process monitoring by local gas detectors 106 can include determination of process endpoints for prior frames 710, monitoring of material removal rate, and/or analysis of removed material composition. The intensity of the most significant peaks from the mass spectra can be plotted against time in trend analysis, giving material removal depth information.

Local photon detectors 108 can be used to detect photons reflected or emitted from the substrate surface 706 near the beam impact location. Detected photons can be used to perform, for example, polarimetry, reflectometry, interferometry, or optical emission spectroscopy on substrate surface 706 material. Substrate surface material properties indicated by such measurements generally include polarization, reflectivity, optical interference, temperature and material composition. Substrate surface 706 material properties, and rates of change and higher-order derivatives of indicated properties, can be used to determine process endpoints, monitor process reaction rates, to monitor the temperature at (or in the vicinity of) the corresponding charged particle beam target impact location, to determine direct material process rate, and for other process monitoring analyses.

Different columns 206 can be configured and/or optimized to perform different (or multiple) types of direct material processing, e.g., some columns 206 can be configured to perform direct material addition, while other columns 206 are configured to perform direct material subtraction, and other columns 206 are configured to perform imaging (e.g., for alignment, registration and/or wafer inspection). The wide range of per-column 206 configurability disclosed herein means that a single multi-process cluster tool 500 (or beam system 400) can be adapted to and optimized for a wide variety of substrate processing applications.

Figure 3A:
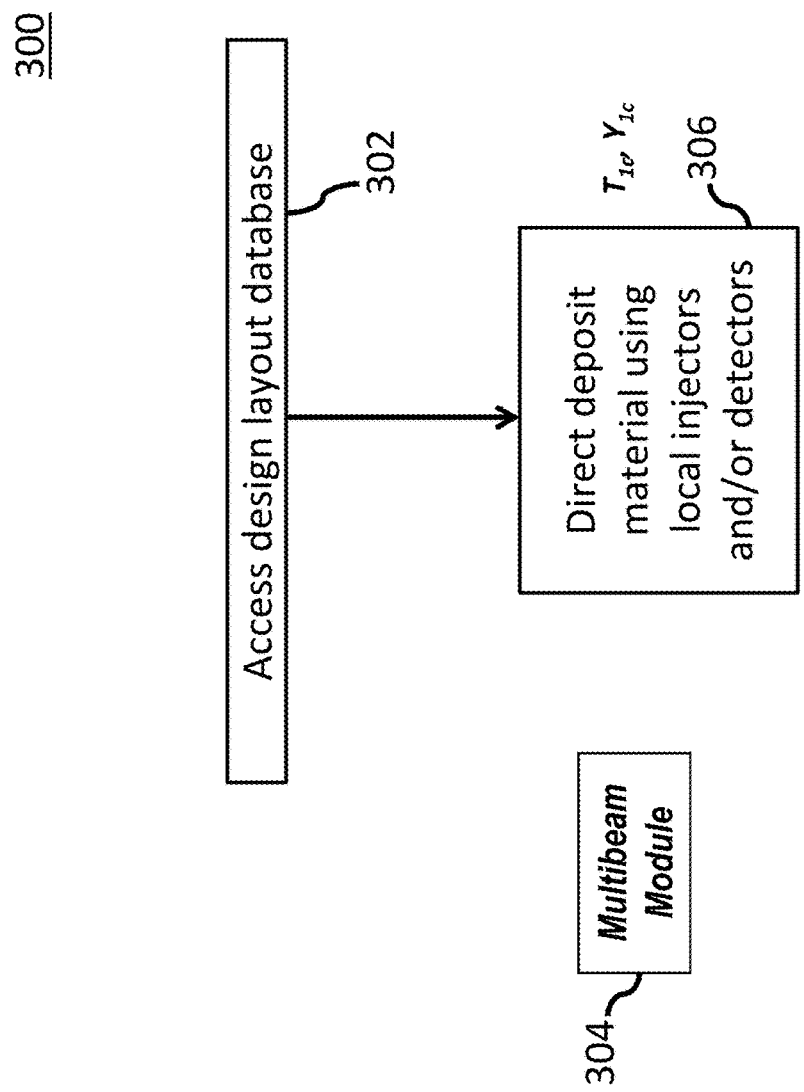
FIG. 3A shows an example of a direct material addition process.

FIG. 3A shows an example of a direct material addition process 300 without a resist layer. A design layout database is accessed 302, and used to designate where and how material will be deposited on the substrate surface 706. A multibeam module 304 (a charged particle beam module 502) is then used to perform material addition to directly deposit pattern material on the substrate surface 706 in a pattern designated by the design layout database, using local gas and/or photon injectors 102, 104, and/or local gas and/or photon detectors 104, 108 in step 306.

Direct material addition can be performed using one or more multi-column charged particle beam systems 400 or a cluster tool 500 using chemical vapor deposition (CVD) (alone, or in concert with other deposition techniques).

Direct material addition can create a layer of pattern specified by the design layout database in its entirety or in a complementary fashion with other patterning processes. For example, material addition can be used to locally interconnect 1-D lines produced by optical lithography. This is similar in design principle to complementary lithography, but without using a resist layer during the charged particle beam phase, and without many of the steps required when using a resist layer; and can advantageously supplement complementary lithography. Direct material addition can be performed as disclosed in U.S. patent application Ser. No. 14/745,463, which is incorporated herein by reference.

Direct material addition, as disclosed herein, can be used to perform direct Atomic Layer Deposition ("direct ALD") as disclosed in U.S. patent application Ser. No. 14/966,165, which is incorporated herein by reference.

Figure 3B:
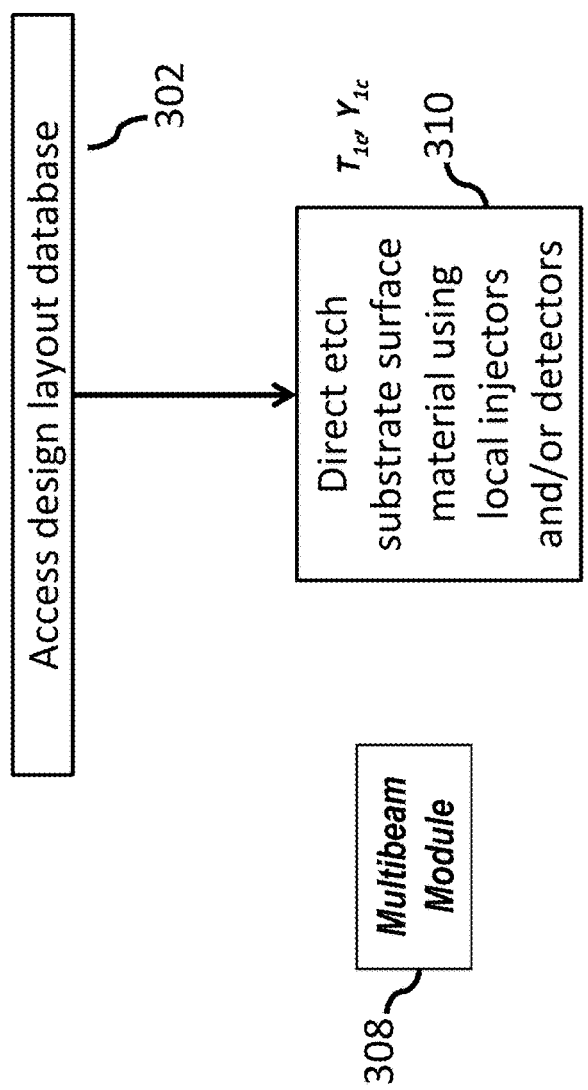
FIG. 3B shows an example of a direct material subtraction process.

FIG. 3B shows an example of a direct material subtraction process 308 without a resist layer. A design layout database is accessed 302, and used to designate where and how substrate surface material will be removed. A multibeam module 304 is then used to perform direct material subtraction (e.g., etching and/or milling) directly on the substrate surface 706 using local gas and/or photon injectors 102, 104, and/or local gas and/or photon detectors 106, 108, in step 310.

Direct material subtraction can be performed using one or more multi-column charged particle beam systems 400 or a cluster tool 500 using reactive ion etching, reactive and/or non-reactive ion milling, or electron-assisted (reactive) etching of semiconductor wafers 200 and other substrates.

Direct material subtraction can create a layer of pattern specified by the design layout database in its entirety or in a complementary fashion with other patterning processes. For example, direct material subtraction can be used to form cut features in 1-D lines produced by optical lithography (similar in design principle to complementary lithography, but without using a resist layer during the charged particle beam phase, and without many of the steps required when using a resist layer, as further explained below). Direct material subtraction is disclosed in U.S. patent application Ser. No. 14/694,710, which is incorporated herein by reference.

Direct material subtraction, as disclosed herein, can be used to perform direct Atomic Layer Etch ("direct ALE") as disclosed in U.S. patent application Ser. No. 14/966,165, which is incorporated herein by reference.

Figure 3C:
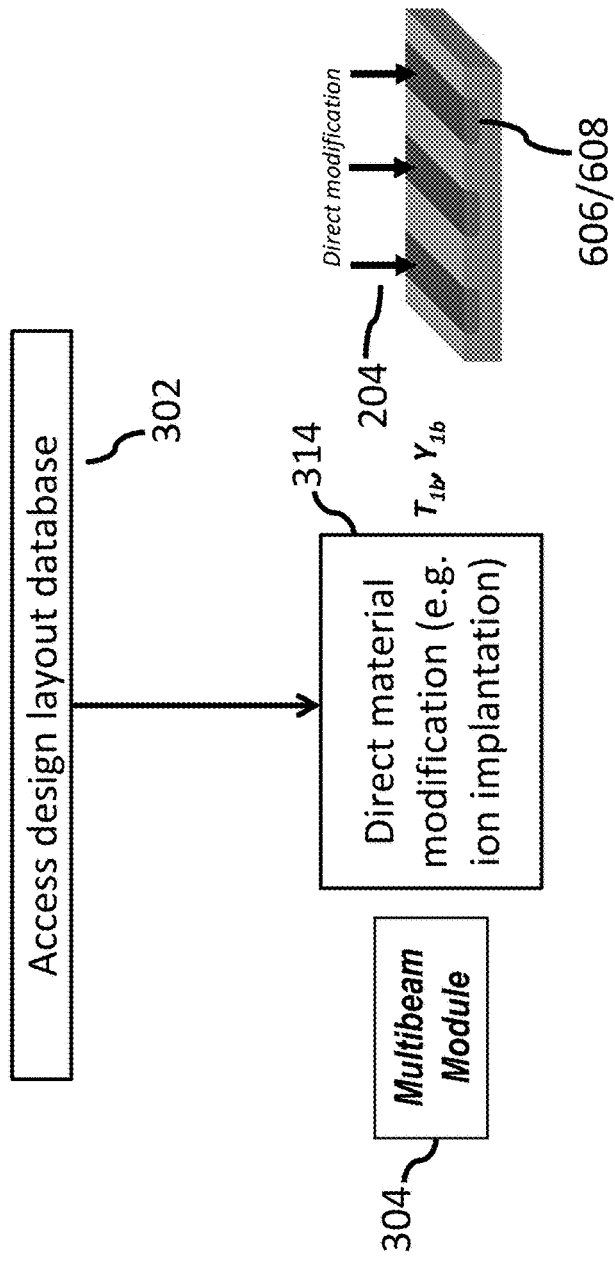
FIG. 3C shows an example of a direct material modification process.

FIG. 3C shows an example of a direct material modification process 312 without a resist layer. A design layout database is accessed 302, and used to designate where and how material will be modified in and on a substrate 704. A multibeam module 304 (e.g., an array 402 or charged particle beam module 502) is then used to perform direct material modification (e.g., ion implantation) to directly modify material in a pattern designated by the design layout database, using local gas and/or photon injectors 102, 104, and/or local gas and/or photon detectors 106, 108 in step 314. Example results of a direct material modification process 300 using (knock-on or direct) ion implantation are also shown in FIG. 3C (uniform-profile 606 doped regions are shown; differentiated-profile 608 doped regions can also be produced).

Direct material modification can be performed using one or more multi-column charged particle beam systems 400 or a cluster tool 500 using direct or knock-on ion implantation.

Direct material modification can create a layer of pattern specified by the design layout database in its entirety or in a complementary fashion with other patterning processes. For example, direct material modification can be used to prepare substrates for selective material deposition or etching; or to add to, subtract from or modify structures produced by optical lithography (or by other substrate processing techniques); or to add new physical and/or compositional structures. Direct material modification, and use thereof to perform knock-on or direct ion implantation, are disclosed in U.S. patent application Ser. No. 14/980,884, which is incorporated herein by reference.

Figure 2A:
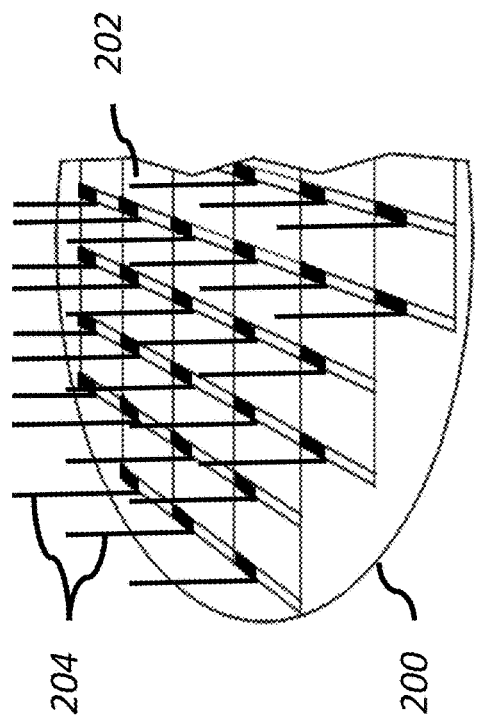
FIG. 2A shows an example of a wafer being scanned by multiple charged particle beams emitted by respective beam columns.
Figure 2B:
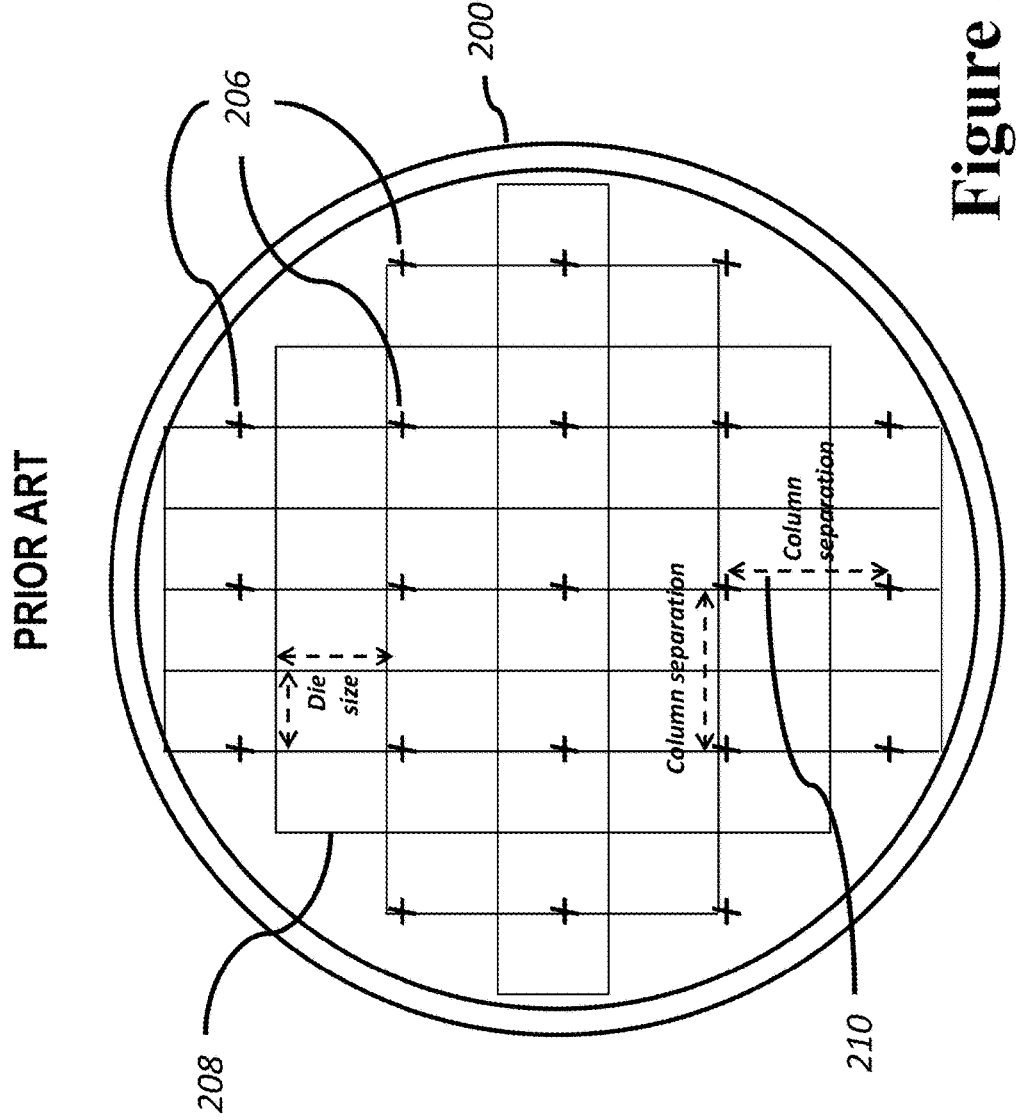
FIG. 2B shows an example of a wafer.
Figure 2C:
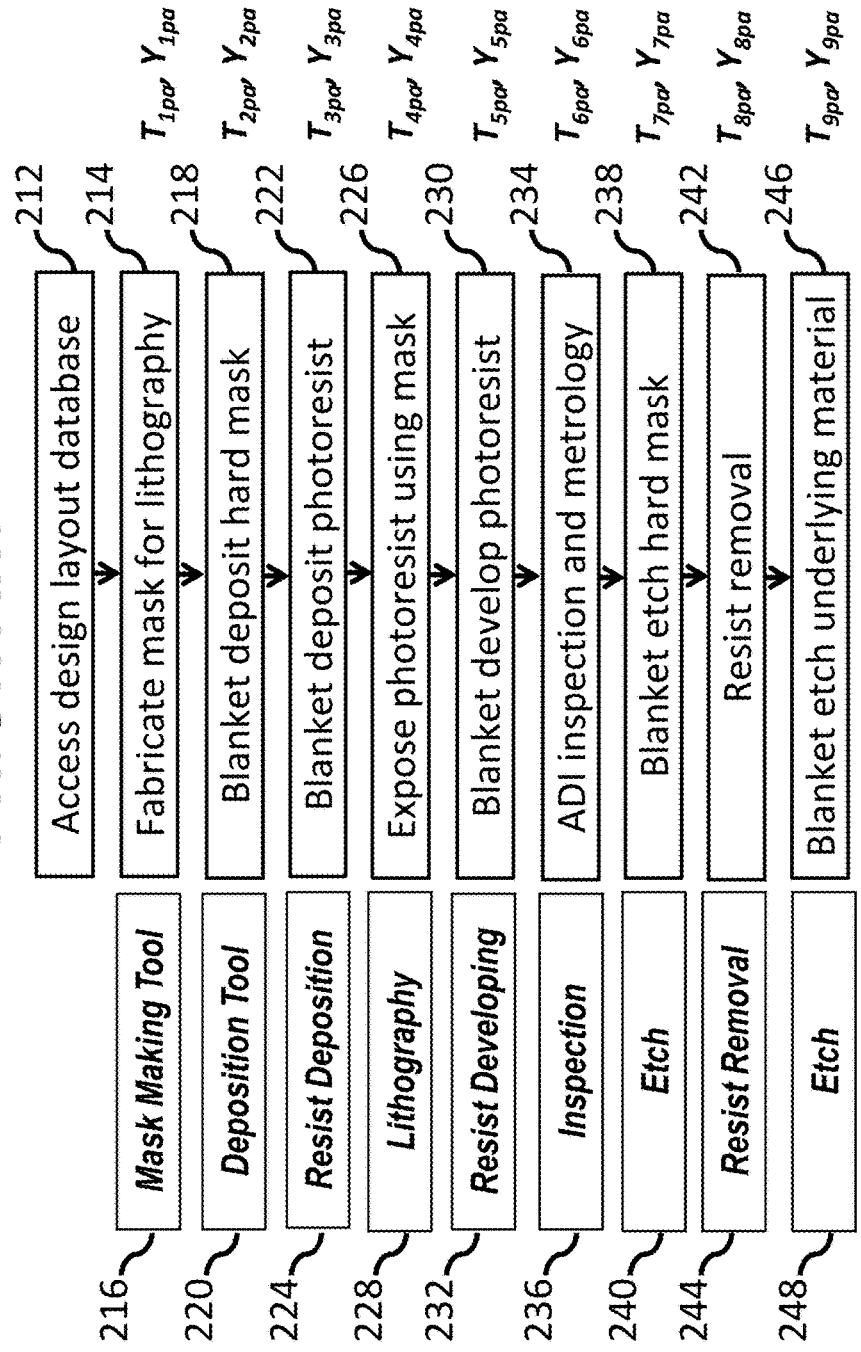
FIG. 2C shows an example of a prior art process for removing material from a substrate surface.
Figure 2D:
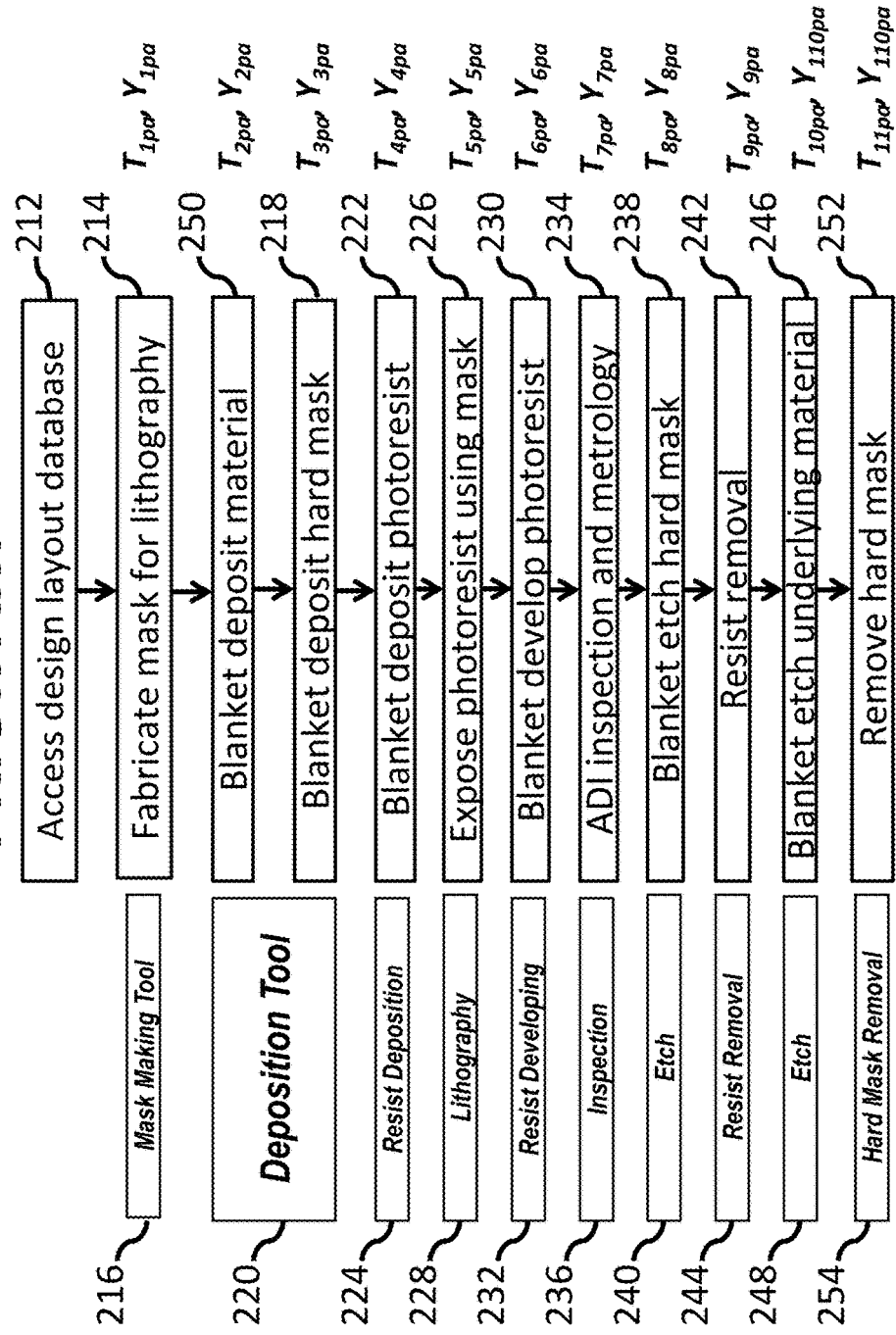
FIG. 2D shows an example of a prior art process for depositing material onto a substrate surface.
Figure 2E:
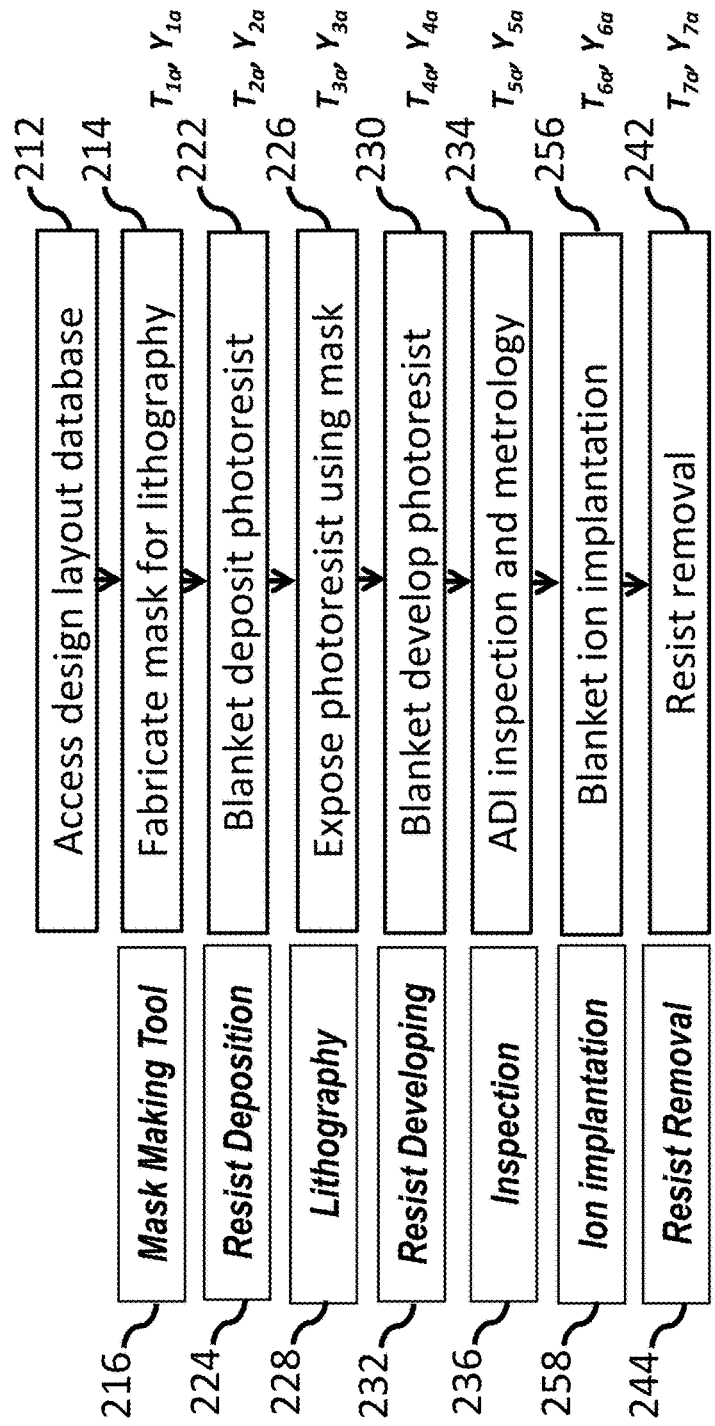
FIG. 2E shows an example of a prior art process for modifying material on (or in) a substrate using ion implantation.
Figure 2F:
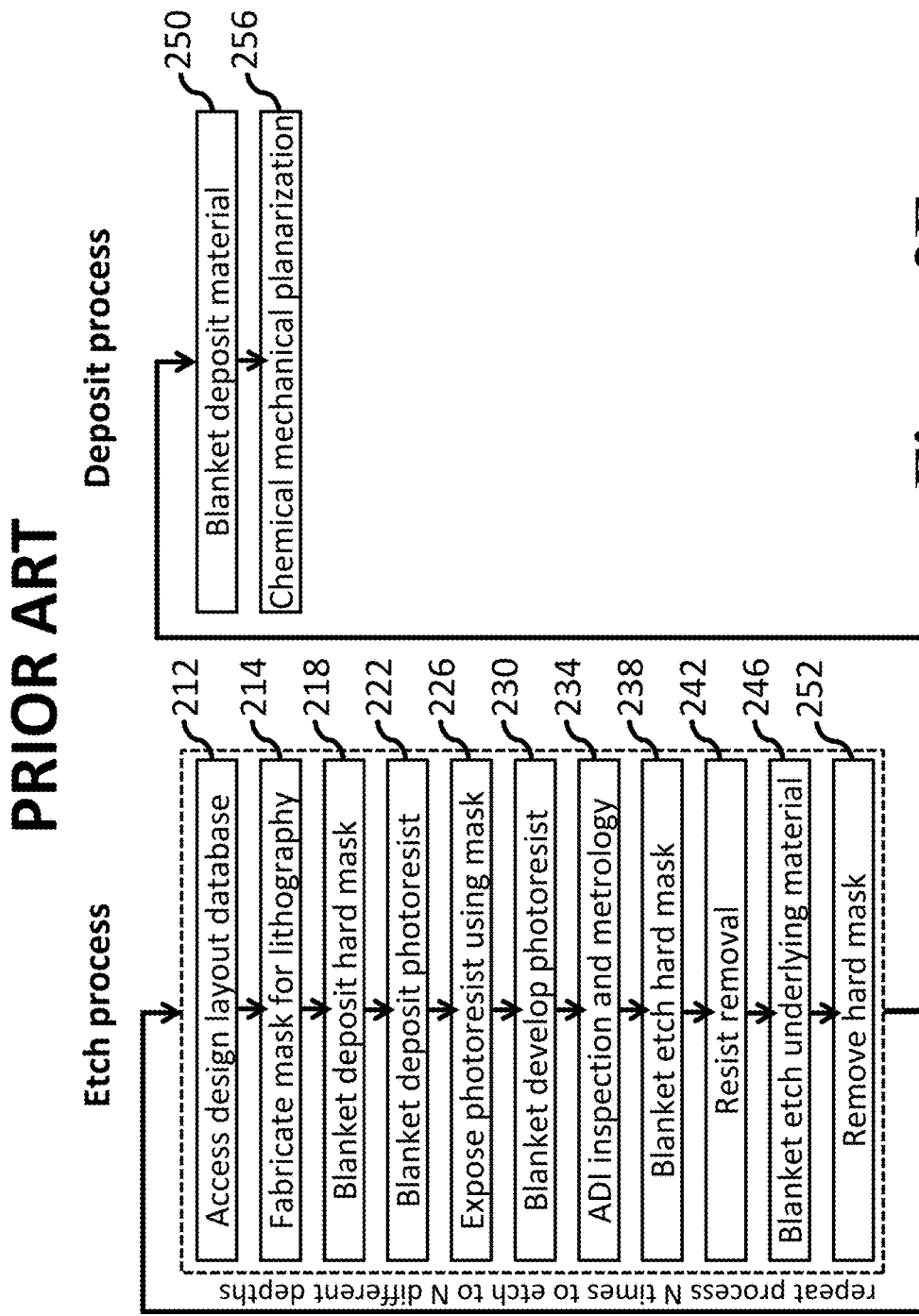
FIG. 2F shows an example of a prior art process for etching differentiated-profile structures that are then uniformly filled.
Figure 2G:
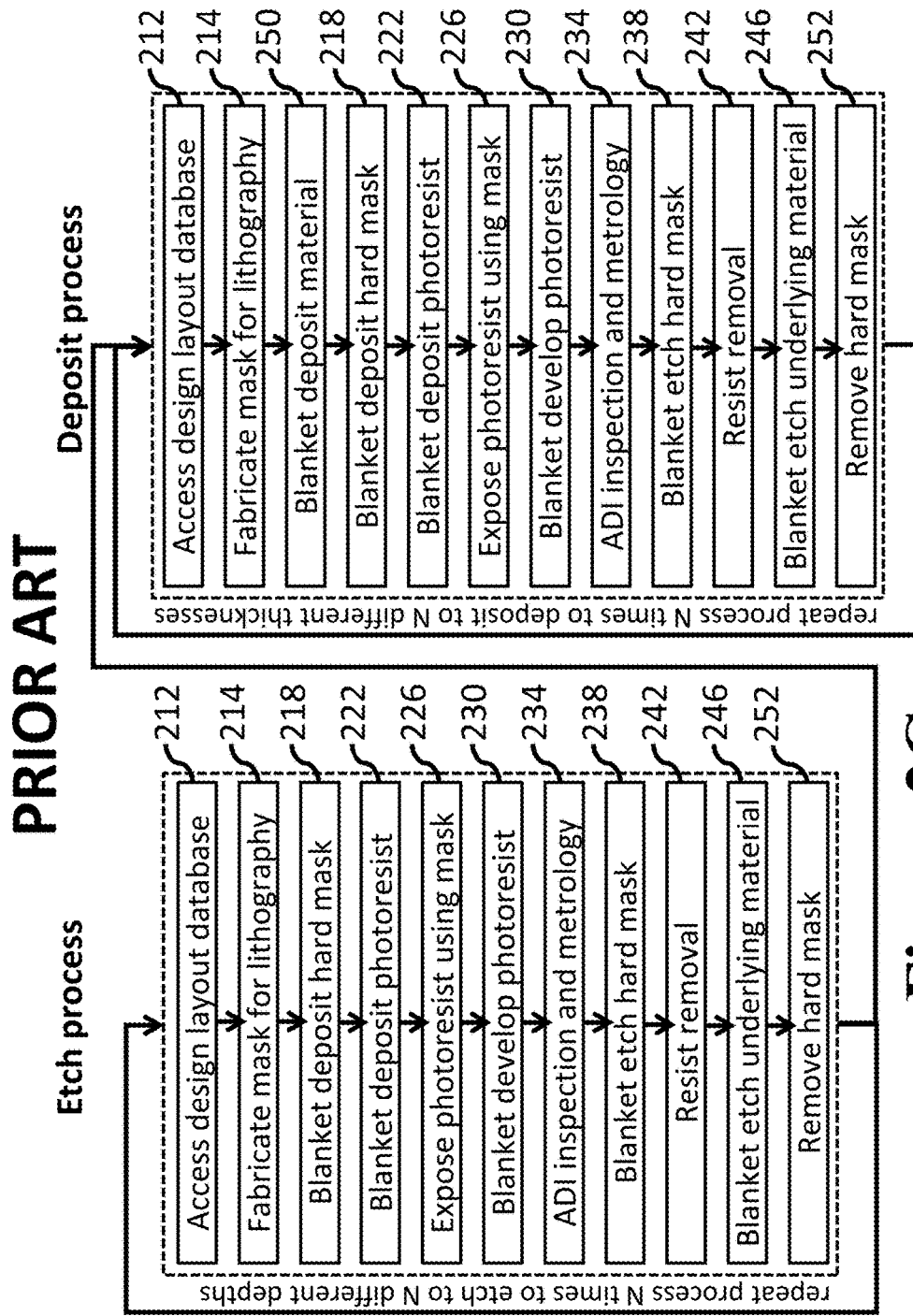
FIG. 2G shows an example of a prior art process for etching differentiated-profile structures that are then differently filled.

The direct material process embodiment(s) shown in FIGS. 3A, 3B and 3C significantly reduce the number of steps required for precise substrate material processing (deposition, removal and modification)—and, concomitantly, removes a wide variety of collateral sources of process-induced error, such as a large number of tool transitions—with respect to the prior art process embodiments shown in FIGS. 2C, 2D and 2E. See Equations 1 and 2. Consequently, manufacturing cycle time can be reduced and device yield can be increased using material subtraction with local injectors and detectors 102, 104, 106, 108 as disclosed herein.

Figure 4:
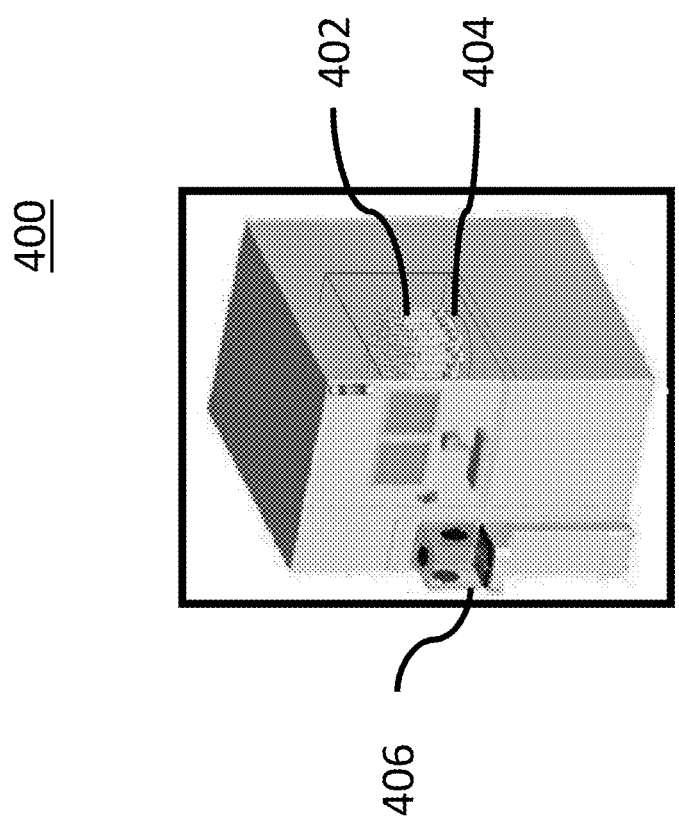
FIG. 4 schematically shows an example of a multiple column charged particle beam system FIG. 5A schematically shows an example of a charged particle beam cluster tool.

FIG. 4 schematically shows an example of a multiple column charged particle beam system 400. An appropriately configured multi-column charged particle beam system 400 can be used for highly localized direct material processing (addition, subtraction and/or modification) or multi-processing using columns 206 configured to perform, for example, (one or more of) CVD, ALD, ALE, reactive or non-reactive ion milling, electron-assisted etching, electron beam milling, or direct or knock-on ion implantation. The system shown in FIG. 4 includes an array 402 of miniature charged particle beam columns 206, a thermally controlled wafer stage 404, a wafer loading and unloading mechanism 406, control electronics, a vacuum system, an alignment system, vibration isolation and magnetic shielding. Depending on (for example) the particular direct material processing application(s) intended, a multi-column charged particle beam system 800 preferably also includes one or more of local gas injectors 102, local photon injectors 104, local gas detectors 106 and local photon detectors 108.

In some embodiments, writing areas 202 of columns 206 in an array 402 overlap so that different columns 206 can perform different direct material processes on the same substrate surface 706 locations in a single pass.

In some embodiments, writing areas 202 overlap so that some columns 206 can perform direct material processes, and other columns 206 can perform direct inspection on the substrate regions affected by those direct material processes, in a single pass.

Figure 5A:
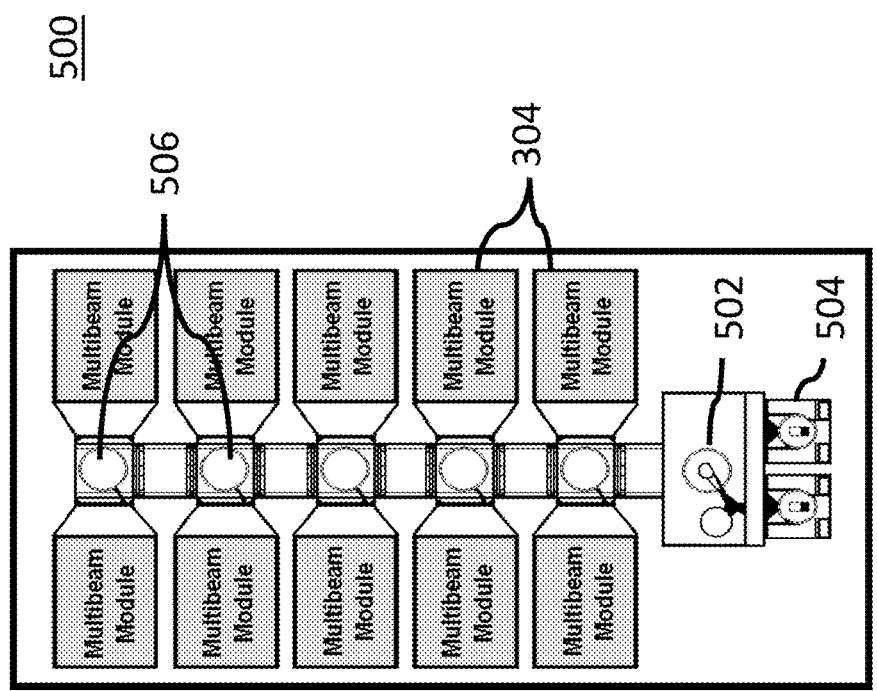
FIG. 5B shows an example of a process for control of charged particle beams for direct inspection and/or direct material processes.
FIG. 5C shows an example of a process flow in a multi-process charged particle beam cluster tool.
FIG. 5D shows an example of a process for etching differentiated-profile structures and filling those structures to arbitrary depths.
Figure 10:
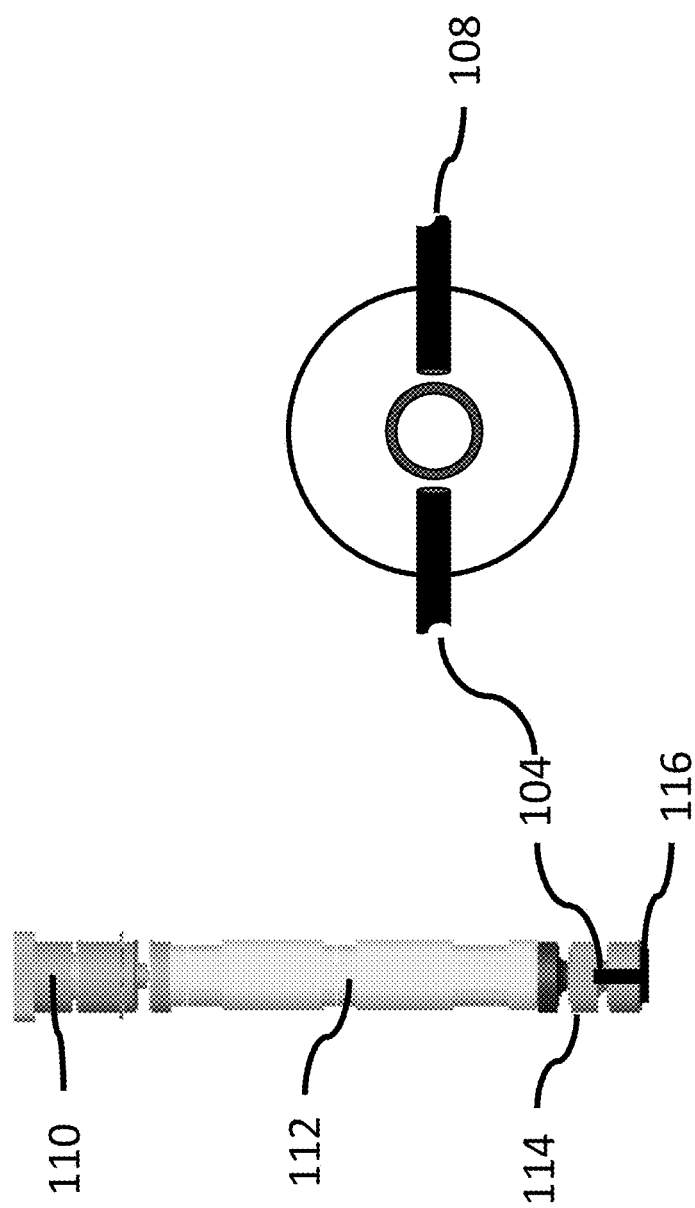
FIG. 10 schematically shows an example of a charged particle beam column.

FIG. 5A schematically shows an example of a charged particle beam cluster tool 500. A charged particle beam cluster tool 500 comprises multiple charged particle beam modules 304. An individual charged particle beam module 304 preferably comprises an array 402 of highly configurable charged particle beam columns 206 (e.g., as shown in FIGS. 1 and 10) in vacuum (for example, with electron sources in ultra-high vacuum at approximately 1E-9 Torr, the rest of the beam column 206 in high vacuum at approximately 1E-6 Torr, and the vacuum chamber volume proximal to the substrate surface 706 at approximately 1E-6 Torr), as well as a wafer stage 404 and alignment mechanism.

Individual modules 304, and/or individual columns 206 within a module 304, can be configured to specialize in a particular type of charged particle beam substrate processing. For example, one module 304 can be configured for direct material addition, while a second module 304 is configured for direct material subtraction using reactive ion etching. In another example, some columns 206 in a module 304 can be configured to perform direct material subtraction using electron beam-assisted etching, while other columns 206 in that module 304 are configured and optimized for direct inspection using electron beam imaging.

In embodiments in which there is no resist (or other blanket material) layer overlaying substrate surface 706, columns 206 in a multi-process cluster tool 500 can be configured to use direct inspection imaging of previous-layer features exposed on the substrate surface 706 to perform registration during direct material processing. This enables improved locality of registration, improving edge placement accuracy and increasing yield.

In addition to process modules 304, a cluster tool 500 generally also comprises a substrate handling system 502, a substrate loading/unloading system 504 and a factory interface. Within a cluster tool 500, a wafer transport system 506 delivers wafers to one or more (e.g., sequentially) of the tool's process modules 304, and can also perform in-vacuum pre-alignment. Other sub-systems necessary for charged particle beam 204 control, gas injection, and substrate processing are not depicted (e.g. control electronics, vacuum systems, alignment systems, vibration isolation, magnetic shielding and gas injection flow control and measurement).

In some embodiments, multiple layers are processed using a multi-process cluster tool 500 or charged particle beam system 400 before removing the substrate 704 from the stage 404. Whether this occurs can depend, for example, on process requirements such as necessity and timing of blanket deposition or blanket etch steps.

Figure 5B:
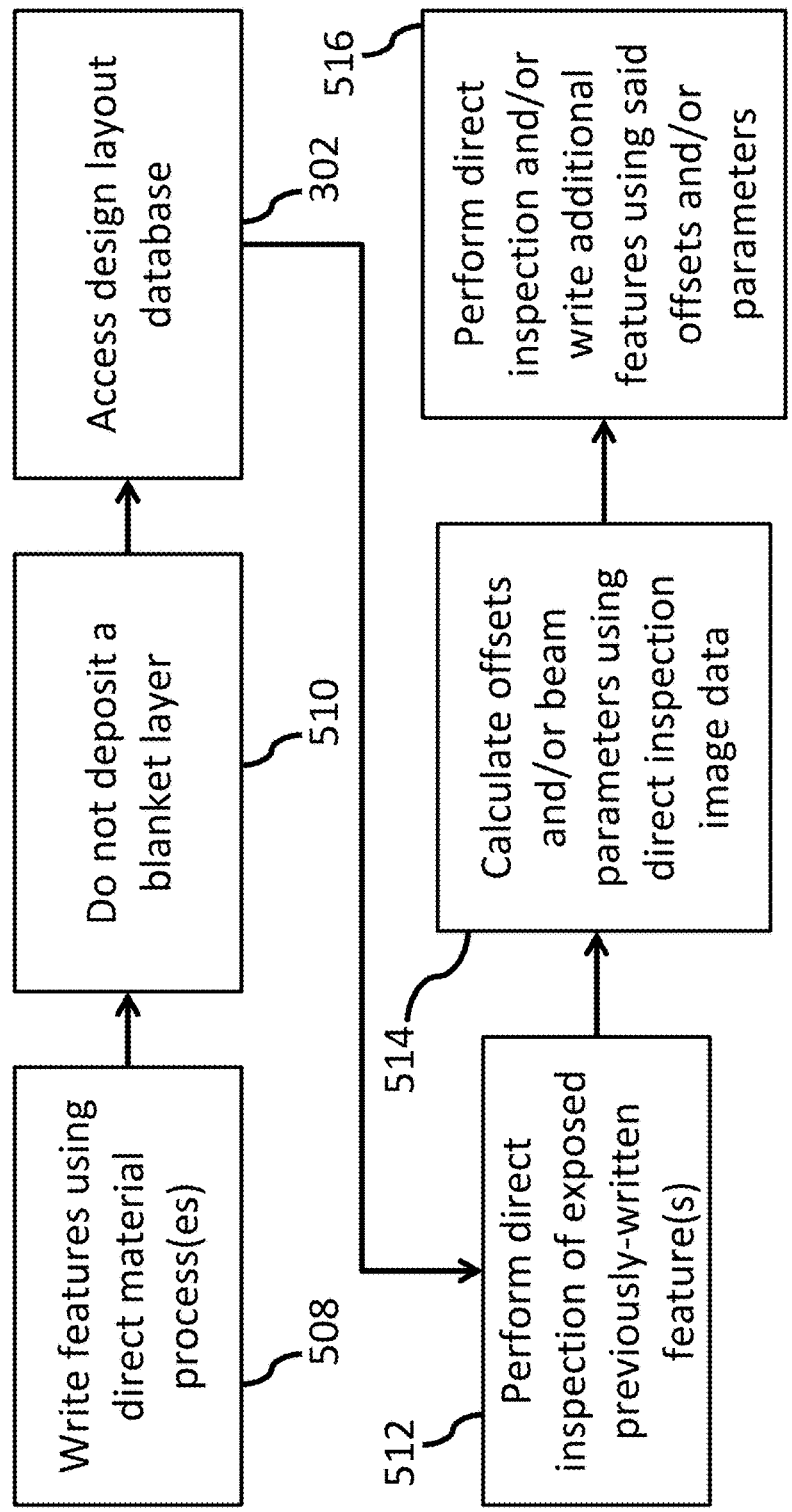

FIG. 5B shows an example of a process for control of charged particle beams 204 using direct inspection of previous-layer features written using a direct material process, and direct inspection and/or writing of additional features using controlled beams 204 performing a direct material process. The process is preferably performed on features previously written by a direct material process 508, with NO blanket layer (e.g., a resist or hard mask layer) having been deposited on the substrate surface 706 since step 508, according to step 510. According to the process as shown in FIG. 5B, the design layout database is accessed 302 to designate the features to perform direct inspection on, and the features to use control results to inspect and/or write (and how). Exposed previously-written features (e.g., previous-layer features) are then imaged using direct inspection 512, and beam 204 control parameters comprising offsets and/or beam parameters (e.g., alignment, registration, critical dimension control, or other beam parameters) are calculated in dependence on resulting image data 514. Highly precise direct inspection and/or direct material processing can then be performed during the same pass (e.g., during the same sub-frame(s), frame(s) or stripe(s)) using said calculated beam parameters 516.

Generally, offsets comprise parameters modifying variables in spatially dependent functions controlling beam targeting. Other typical beam parameters include beam energy (landing voltage), beam focus, exposure time, beam current, beam size, shape or profile, and beam scan rate.

Figure 5C:
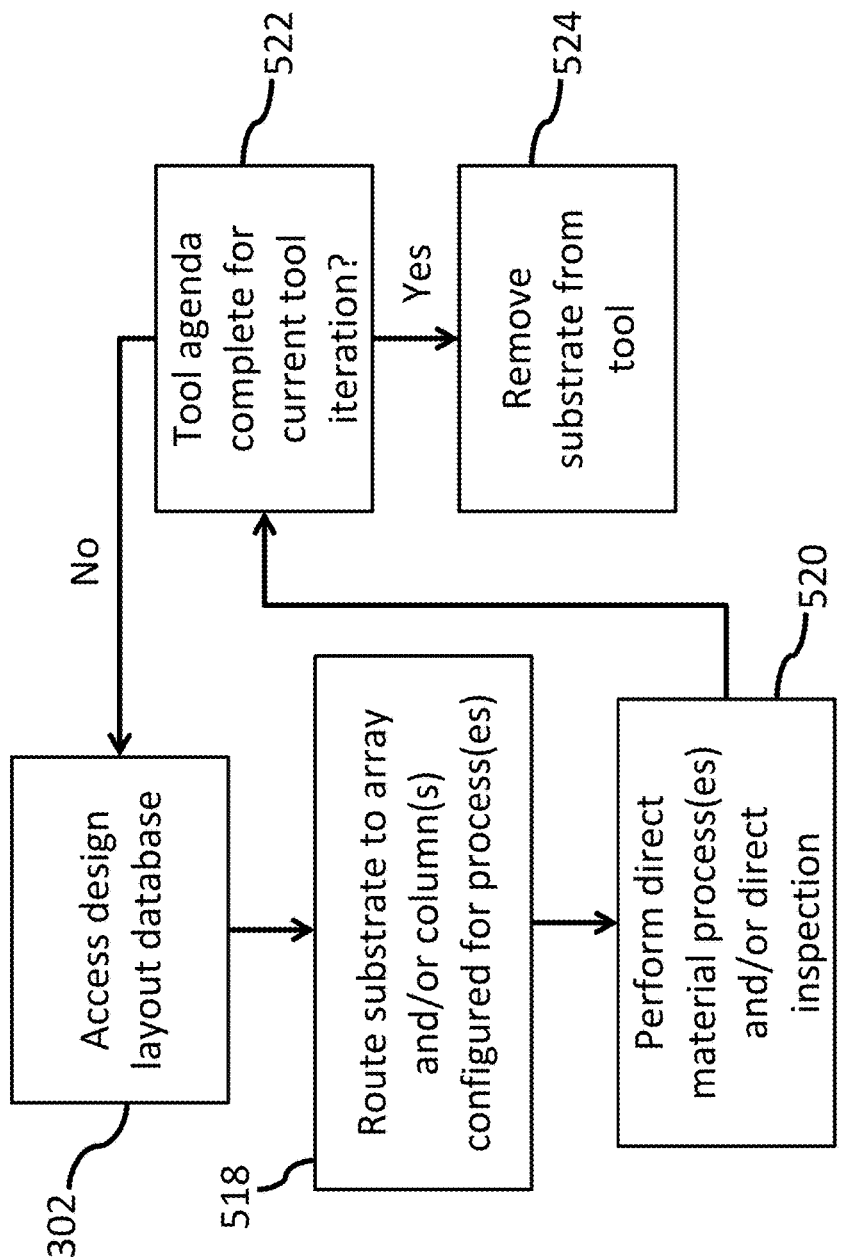

FIG. 5C shows an example of process flow within a charged particle beam cluster tool 500 configured to perform multi-processing—a multi-process cluster tool 500. (This process can also be adapted to a charged particle beam system 400 with columns configured for multi-processing.) Multi-process cluster tools 500 enable new paradigms of substrate device design, such as a 3-D design layout database, in which shapes within individual layers have a Z directional component (see FIGS. 6A, 6B, 6C and 6D).

It will be apparent to one of ordinary skill in the arts of charged particle beam substrate processing that because columns 206, local gas and photon injectors 102, 104 and local gas and photon detectors 106, 108 are configured to process corresponding frames highly locally, such that different columns 206 can process different frames differently, independently (i.e., without interfering with processing by other columns 206) and simultaneously, that various combinations of column 206 configurations (e.g., some columns 206 configured for direct material addition, and others for direct material subtraction) within individual arrays 402 can be assembled for use in a variety of applications.

In some embodiments, individual columns 206 can be configured to perform multiple different direct material processes in the same pass; preferably, a column 206 so configured performs direct material processes serially to prevent cross-interference between the different processes.

As shown in FIG. 5C, a design layout database is accessed 302, and used to designate where and how and with what process(es) material will be processed and/or inspected in and on a substrate 704. The substrate is then routed to an array 402 (or columns 206 in an array 402) configured to perform the designated process(es) 518, and that direct material process (or processes) and/or direct inspection is performed on the substrate 704 in step 520. Based on the design layout database information, if the tool agenda (writing and/or inspection of one or more layers and/or portions of one or more layers) has been completed for the current iteration of use of the tool 500 (or beam system 400) as determined in step 522, the substrate 704 is removed from the tool 500 (or beam system 400) in step 524. Otherwise, the process repeats from step 302.

In some embodiments, this enables a first set of functional structures to be manufactured, and then one or more additional, distinct sets of functional structures (e.g., comprising different materials, different functional types or different layers) to be manufactured precisely overlaying the first set of functional structures (or each other) with minimal overlay error, without transferring the substrate 704 to another tool or removing the substrate 704 from the vacuum chamber.

For example, direct material subtraction can be performed using registration with respect to previously written features to improve edge placement accuracy. Preferably, beam 204 registration is performed during direct material subtraction (or other direct material process) to improve edge placement accuracy, by the same beams 204 as those used to provide substrate surface 706 material removal energy.

In some embodiments, since direct material subtraction is a resistless process, previous layers of pattern will be exposed on the substrate surface 706. With no resist or other blanket deposition layer, the topmost layer(s) of features will generally not be covered or obscured. In such embodiments, direct inspection for registration (overlay control, matching locations of features in a new layer of pattern to locations of features in previously-written layers of pattern) can be performed:

using exposed features (in some embodiments, functional features) as direct inspection targets to capture image data for registration;

during the same pass as direct material subtraction (or other direct material process), preferably prior to and/or temporally interleaved with direct material subtraction performed on the same frame 710 as said direct inspection; said direct material subtraction then continuing in the same frame 710 using the offsets and/or other beam parameters calculated in dependence on said image data;

highly locally to direct material subtraction (or other direct material process); and with high speed and precision.

Additional advantages emerge from performing registration directly with respect to previously-written, previous-layer functional features. Targets written using resist (see FIG. 2D) are generally multiple process steps (and multiple tool transfers) removed from registration to previous-layer features. Such intervening steps generally add overlay error, meaning that registration targets written using resist can themselves introduce overlay error. Also, registration targets written with resist generally do not lie on previously-written features designated for further processing (that is, there is generally a limit to how local registration targets can be to the substrate 704 locations designated for processing). Direct material processing can enable registration to features located at the precise substrate 704 locations designated for processing. For example, a via etched using direct material subtraction can be used as a registration target immediately prior to filling that via using direct material addition.

In some embodiments, direct material subtraction can be performed with registration (preferably frequent registration) using direct inspection to enable use of beams 204 to cut lines (or vias) with improved edge placement accuracy. Immediately before a column 206 uses direct material subtraction to write cuts in Metal-X lines, the local column controller can calculate precise offsets for the cuts within the frame 710 by using direct EBI (direct Electron Beam Inspection) to observe the precise position of Metal-X lines and Via-(X−1) layer cuts. This enables registration for purposes of direct material subtraction directly with respect to features to be altered by said removal, significantly enhancing locality (both in space and time) of registration to processing locations and actions. Frequently registering to previously patterned layers—preferably, performing registration to features in previously patterned layers frame-by-frame 710—reduces overlay errors, improves edge placement accuracy and improves yield.

In some embodiments, direct inspection can be used to improve edge placement accuracy by performing registration before and during direct material subtraction and direct material addition performed on the same substrate surface 706 regions, without stage transfer or vacuum breach, by the same multi-process cluster tool 500. Direct material addition and direct material subtraction can also be performed in a single pass, further reducing overlay errors. For example, immediately before using direct material subtraction to pattern gate cuts, the column controller can calculate precise offsets for the cuts within the frame 710 by using direct inspection (e.g., direct EBI) to observe the precise position of gate lines and of the Active layer. Then, immediately following the gate cuts, direct material addition can be used to pattern the contact layer (preferably with re-registration performed between direct material subtraction and addition; though in some embodiments the same offsets can be used for gate cuts and contact layer patterning). Direct material subtraction and direct material addition can also be performed as ALE and ALD, respectively, resulting in finer (atomic) control of etch depth and deposition thickness.

In some embodiments, direct material addition and direct material subtraction can be used to destroy and repair defects in the substrate pattern before the substrate 704 leaves the vacuum space in which the defects were produced (e.g., immediately after, or during, related processing), without masks and without resist. For example, direct inspection can be used to find and identify mouse bite, disconnect and other void-type defects in the substrate pattern, and direct material addition can be used to directly fill the erroneous void (deposit to fill). Direct inspection can also be used to find and identify protrusions or shorts which can then be repaired using direct material subtraction (e.g., direct etch).

Unit processes (e.g., direct material addition, subtraction or modification processes, as well as metrology, alignment or inspection processes) can be developed comprising information such as sequences of process steps, timing for process steps, process gasses injected per process step, flow rates per injected gas, beam landing energy per process step, beam dose per process step, (local) substrate temperature per process step (which can also correspond to specification of photon injection timing, wavelength and power per process step, as well as stage cooling control information), end point thresholds, and other process-specific control information.

Recipes for performance of particular applications can be assembled from a library of unit processes. Recipes can comprise information such as module 304 configuration(s) (e.g., pressure), column configuration(s) (e.g., process parameters), sequences of unit processes per column, customization algorithms and other application-specific configuration and control information. A recipe database can be populated with assembled recipes for use in controlling a cluster tool 500 or beam system 400.

Cluster tool 500 or beam system 400 control can be partitioned into, for example, a module controller (per module 304), a stage controller (per stage 404), and local column controllers (preferably one local column controller per column 206, e.g., 88 local column controllers for 88 columns 206 in an array 402, which can be one of multiple arrays 402 in a cluster tool 500). Preferably, corresponding module controller, stage controller and column controllers communicate with each other during each stage of a substrate process, e.g., loading a substrate 704 and preparing it for processing; processing the substrate 704; and unloading the substrate 704.

Generally, a module controller will monitor and control pressure and temperature, flag problems, and send alerts (or alarms) when module 304 conditions pass specified thresholds (e.g., outside of desired norms). During substrate 704 loading and preparation, a module controller can, for example, coordinate substrate 704 loading, alignment, registration, calibration and loading of relevant recipe information into corresponding column controllers (different columns 206—in some embodiments, each different column 206—can have a different sequence of processes), and determine stage 704 motion and timing for the process sequence(s). During processing, a module controller can, for example, coordinate process sequence timing per column 206, coordinate stage 404 motion, monitor columns 206 and column end-point detection, and coordinate re-registration and re-calibration as necessary. During substrate 704 unloading, a module controller can, for example, coordinate the unloading.

During substrate 704 loading and preparation, and during substrate 704 processing, a stage controller can, for example, perform motion control and provide motion and position information to the module controller and local column controllers. During substrate 704 unloading, a stage controller can, for example, perform motion control.

During substrate 704 loading and preparation and during substrate 704 processing, column controllers can, for example, control charged beams, adjust beam deflections to correct errors (e.g., adjust offsets based on imaging of fiducial marks or pattern features, or to compensate for stage 404 motion, temperature or vibration), capture substrate images, or locate features (e.g., fiducial marks or functional features) and determine offsets. During substrate 704 processing, column controllers can also, for example, control local gas and photon injectors and detectors 102, 104, 106, 108, monitor local process conditions (using various metrology options, e.g., as described herein), and detect process endpoints.

Those of ordinary skill in the arts of charged particle beam substrate processing will understand that while particular roles have been described with respect to module controllers, stage controllers and column controllers, other control and metrology roles can be filled by respective devices, and roles can be subdivided and/or assigned differently.

Figure 5D:
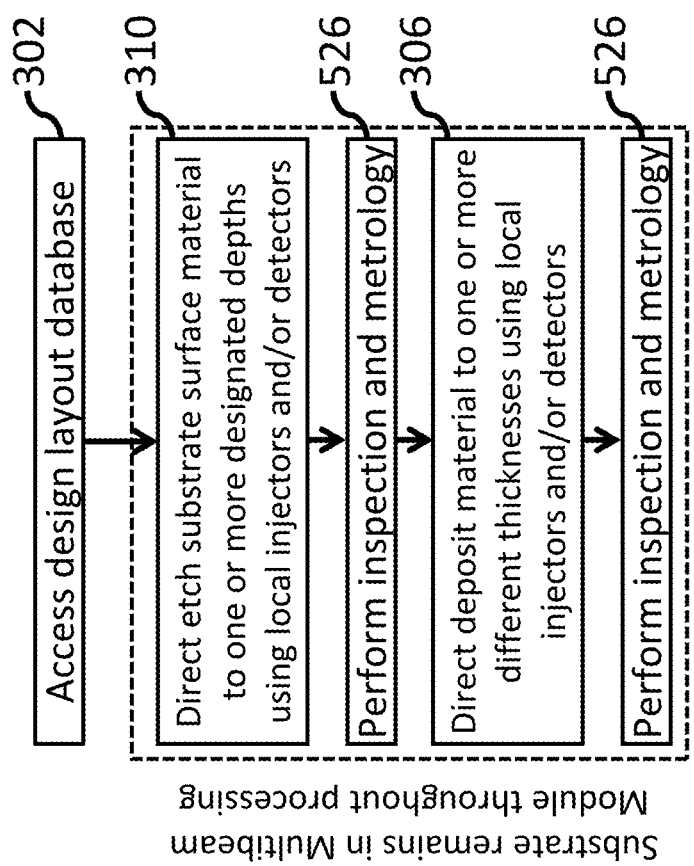

FIG. 5D shows an example of a process for etching differentiated-profile structures and filling those structures to arbitrary depths using direct material addition and subtraction, and direct inspection. The design layout database is accessed 302, and used to designate where and how material will be removed and added. Direct material subtraction is then performed, using local gas and/or photon injectors and/or detectors 102, 104, 106, 108, to etch (or mill) substrate surface 706 material to the one or more (in some embodiments, various) depths, and at the locations, designated by the design layout database 310. Inspection and metrology, preferably using direct inspection, is then performed 526, to ensure accurate processing and effective process control and feedback, and to enable repairs if necessary. Direct material addition is then performed using local gas injectors 102, and (in some embodiments) local photon injectors 104 and/or local gas or photon detectors 106, 108, to deposit material (in some embodiments, multiple different materials) to the one or more (in some embodiments, various) thicknesses, and at the locations, designated by the design layout database 310—i.e., the locations etched in step 310. The results can comprise uniform 602, 610 or differentiated-profile 604, 612 structures that are fully filled 614 or partially filled 616.

Those of ordinary skill in the arts of charged particle beam substrate processing will understand that these and other combinations of direct material processes and/or direct inspection can be used for these and other substrate 704 processing applications.

Multi-processing beam systems 400 and cluster tools 500 can also be used in production of devices such as gate-all-around (GAA) FETs, vertical nanowire FETs, and 3-D NAND.

Figure 6A:
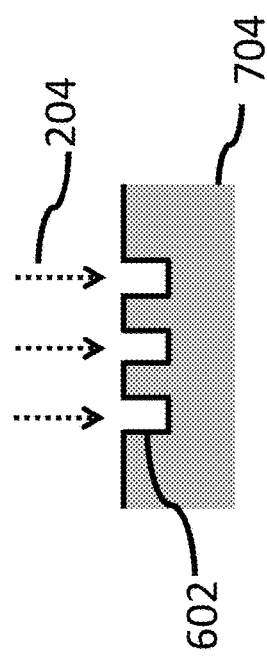
FIG. 6A schematically shows an example of the results of a uniform-profile direct material subtraction process.

FIG. 6A schematically shows an example of the results of a uniform-profile direct material subtraction process, including uniform-depth features 602.

Figure 6B:
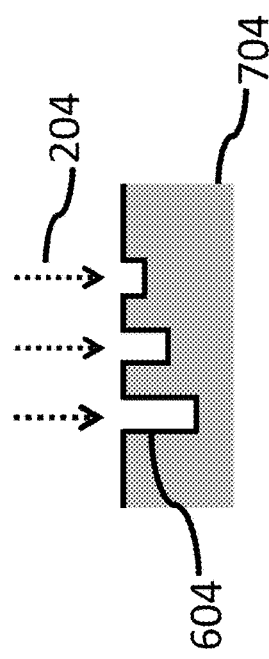
FIG. 6B schematically shows an example of the results of a differentiated-profile direct material subtraction process.

FIG. 6B schematically shows an example of the results of a differentiated-profile direct material subtraction process, including differentiated-depth features 604.

FIG. 6C schematically shows an example of the results of a uniform-profile direct material modification process, including uniform-depth doping profiles 606.

FIG. 6D schematically shows an example of the results of a differentiated-profile direct material modification process, including differentiated doping profiles comprising differentiated-depth and/or differentiated concentrations of dopants 608.

Figure 6E:
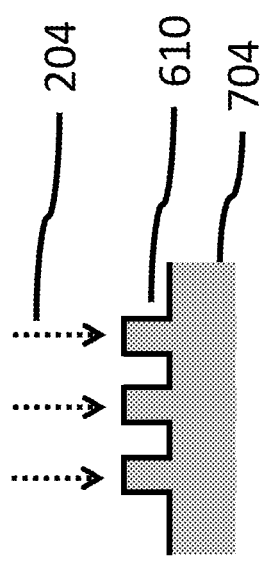
FIG. 6E schematically shows an example of the results of a uniform-profile direct material addition process.

FIG. 6E schematically shows an example of the results of a uniform-profile direct material addition process, including uniform-height features 610.

Figure 6F:
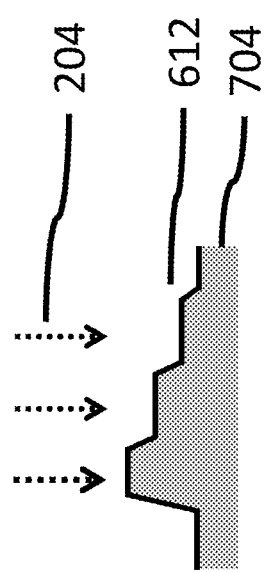
FIG. 6F schematically shows an example of the results of a differentiated profile direct material addition process.

FIG. 6F schematically shows an example of the results of a differentiated profile direct material addition process, including differentiated-height features 612.

Differentiated-profile features 604, 608, 612 (or uniform profile features 602, 606, 610) can be written in a single pass, since material deposition, removal or modification is performed directly, to an arbitrary height or depth or concentration that is fully localized to locations affected by beams 204. For example, tall and short pillars can be manufactured in the same layer by the same array 402 performing the same direct material addition process; and deep and shallow trenches and/or holes can be manufactured in the same layer by the same array 402 performing the same direct material subtraction process.

Columns 206 can be configured independently to process material simultaneously but differently; e.g., to write different patterns to different depths or heights at different rates using different beam and (gas and/or photon) injection parameters. Since columns 206 are controlled independently, they can be used to create local variations in pattern and dopant profiles. Differentiated-profile material addition and subtraction (which can create 3-D structures) and modification can be achieved by varying, for example, exposure time, dose, local reactant partial pressure, or local reactant chemistry beneath a charged particle beam column 206 as the targeted beam position is moved.

Figure 6G:
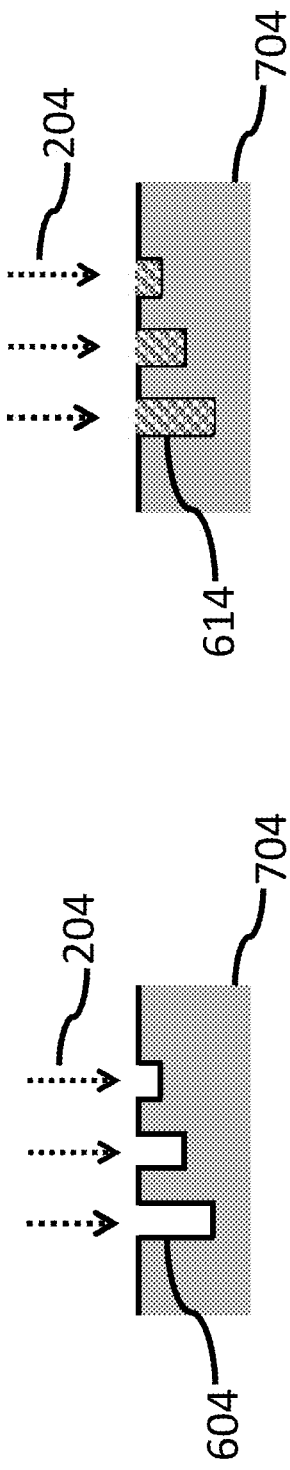
FIG. 6G shows an example of etch structures manufactured using direct material subtraction and fully filled using direct material addition.
Figure 6H:
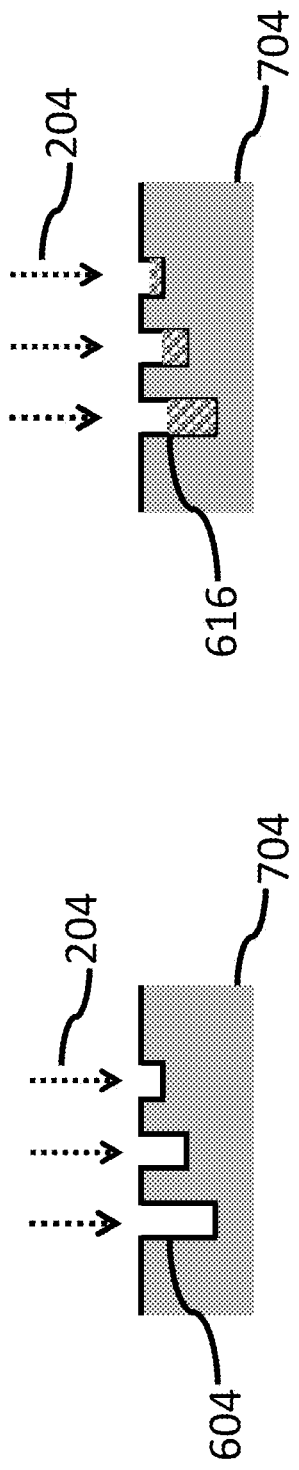
FIG. 6H shows an example of etch structures manufactured using direct material subtraction and partially filled using direct material addition.

For example, FIGS. 6G and 6H show etch structures manufactured using direct material subtraction which have been fully filled 614 or partially filled 616 using direct material addition (see, e.g., FIG. 5D). Because direct material processes can be performed independently (without cross-interference) within the same vacuum space by arrays of highly-configurable columns, fully filled 614 and partially filled 616 differentiated-profile etched structures can be manufactured in two passes, without tool transfer, without resist and without masks.

Figure 7A:
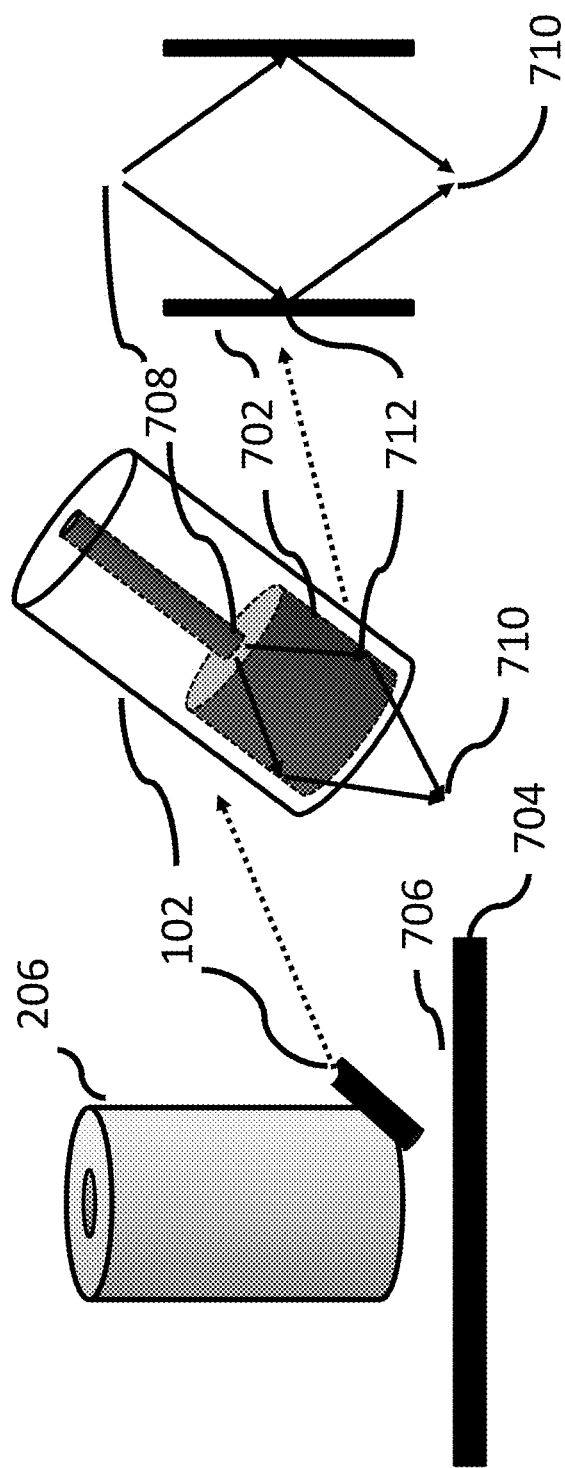
FIG. 7A schematically shows an example of a local gas injector mounted on a charged particle beam column.

FIG. 7A schematically shows an example of a local gas injector 102 mounted on a charged particle beam column 206. The gas injector preferably 102 includes a kinetic lens 702, comprising a smooth rigid body (preferably made of metal), to increase the partial pressure of gas at the focal point of the kinetic lens 702 on the substrate 704 surface 706 by focusing or collimating the gas particle flow from the gas injector outflow opening 708. Various designs of kinetic lens 702 are possible; the example shown in FIG. 4A is a cylindrical kinetic lens 702.

The gas injector 102 is connected to one or more gas sources, comprising the gas(ses) to be injected by the gas injector 102 to create or assist in creating a desired chemical environment at the main-field deflection area 710 on the substrate surface 706. Multiple gas injectors 102, injecting the same or different gasses, can be used.

Preferably, one or more local gas injectors 102 are configured to inject a process gas (appropriate to the particular direct material process) per column 206 performing reactive processes or other processes using adsorbed gasses (e.g., direct material addition, direct material subtraction using etching and direct material modification using knock-on ion implantation). Local gas injectors 102 are preferably mounted on or near the bottom of corresponding columns 206, as close to corresponding main-field deflection areas 710 as possible. (A main-field deflection area 710 is generally in a fixed position relative to the corresponding column 206, and moves across the substrate's surface 706 as the stage 404 moves).

Gas flow from a local gas injector 102 is preferably limited to the molecular flow regime (not viscous flow) to enable proper function of a kinetic lens 702 connected to the gas injector outflow opening 708. (If the gas flow is in a viscous flow regime, the kinetic lens 702 will generally not function as a lens.) In the molecular flow regime ("molecular flow"), the mean free path for gas particles (atoms or molecules of the gas) is large compared to a characteristic dimension of the local gas injector 102 or detector 106 (e.g., the path taken by gas particles between the substrate surface 706 and the gas outflow or inflow opening 708, 714). This makes it much more likely that gas particles will collide 712 with the side of the lens 702, or (for a gas injector 102) the substrate surface 706, or (for a gas detector 106) enter the gas inflow opening 714, before hitting another gas particle.

A "kinetic lens" 702 is an arrangement of one or more smooth and rigid, flat and/or curved surfaces configured to reflect gas particles, fixed in position with respect to a corresponding gas injector outflow opening 708 or gas detector inflow opening 714; such that (for a gas injector) gas particles originating at a gas injector outflow opening which intersect 712 with the kinetic lens 702 are collimated or redirected (e.g., focused) towards the corresponding main-field deflection area 710; and such that (for a gas detector 106) gas particles originating at the beam impact location (or the main-field deflection area 710) which intersect 712 with the kinetic lens 702 are redirected (e.g., focused) towards the gas detector inflow opening 714. (Generally, surfaces of a kinetic lens 702 can be thought of as similar to optical mirrors, but for gas particles.) Various designs of kinetic lens 702 can be used (see, for example, FIGS. 7A, 7B, 7C, 7D and 7E).

Preferably, kinetic lens 702 surfaces are arranged so that they do not prevent particles (atoms or molecules) of outflow gas within the kinetic lens 702 from reaching the substrate surface 706; and do not prevent particles of inflow gas within the kinetic lens 702, originating from the main-field deflection area 710 of the corresponding column 206, from reaching the inflow opening 714.

A kinetic lens 702 can be used to improve localization to the main-field deflection area 710 of increased partial pressure of an injected gas. A kinetic lens 702 can also be used to increase specificity and collection rate for a gas detector 106. "Specificity", as used herein, refers to the selectiveness of a gas detector 106 corresponding to a column 206 for material that originated within a corresponding frame 710 and not from, e.g., the frame 710 of another column 206.

Figure 7B:
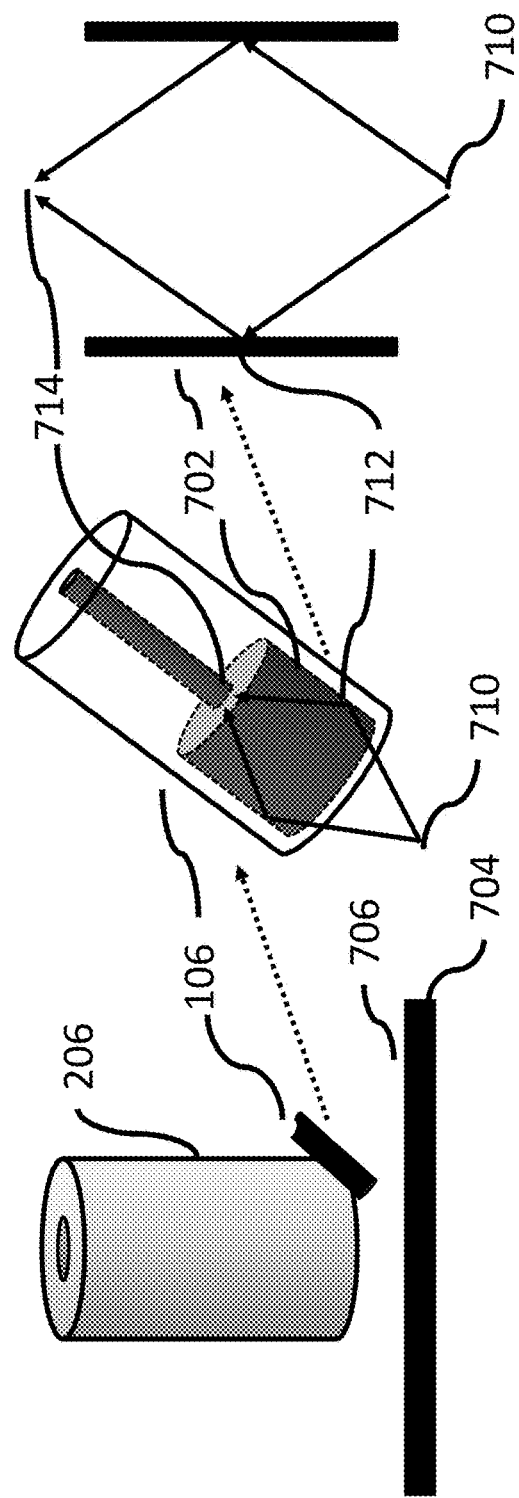
FIG. 7B schematically shows an example of a local gas detector mounted on a charged particle beam column.

FIG. 7B schematically shows an example of a local gas detector 106 mounted on a charged particle beam column 206. Preferably, a local gas detector 106 comprises a gas inflow opening 714 connected to a kinetic lens 702 configured to redirect gas particles intersecting 712 the kinetic lens 702 into the gas inflow opening 714. The gas inflow opening 714 is connected to a secondary ion mass spectrometer configured to analyze incoming gas particles and perform process monitoring (e.g., detecting etched or milled material or process byproducts, or monitoring partial pressure of injected gas) and provide control feedback using said analysis.

Figure 7D:
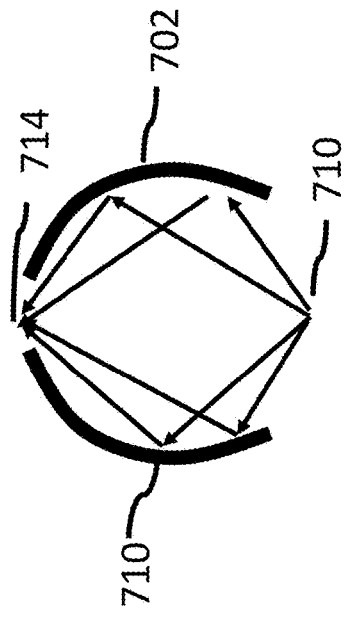
FIG. 7D schematically shows an example of a gas injector with a rotational ellipsoid kinetic lens.
Figure 7C:
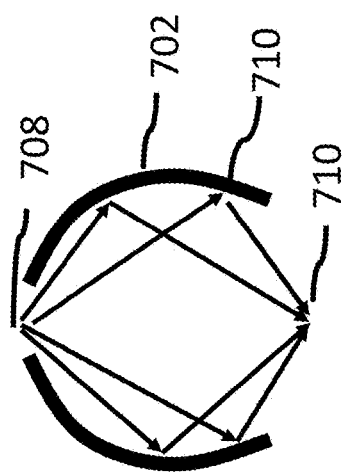
FIG. 7C schematically shows an example of a gas injector with a rotational ellipsoid kinetic lens.

FIG. 7C schematically shows an example of a gas injector 102 with a rotational ellipsoid kinetic lens 702.

FIG. 7D schematically shows an example of a gas detector 106 with a rotational ellipsoid kinetic lens 702.

A kinetic lens 702 is preferably shaped as a (truncated) rotational ellipsoid (an ellipsoidal reflector, with two equal minor axes and a longer major axis). Advantageously, gas particles which originate at one major axis focus and which intersect the kinetic lens 702 surface are reflected towards and converge at the other major axis focus. Preferably, one major axis focus of the rotational ellipsoid is located at the main-field deflection area 710 on the substrate surface, and the other major axis focus is located at the gas outflow or inflow opening 708, 714 (which can be modeled as a point source or point sink, respectively, for this purpose).

Preferred embodiments using gas injectors 102 use rotational ellipsoid kinetic lenses 702 configured such that gas particles originating at the gas injector outflow opening 708 that intersect 712 the kinetic lens surface 702 are reflected towards the main-field deflection area 710, increasing partial pressure of the gas in the frame 710.

Preferred embodiments using gas detectors 106 use rotational ellipsoid kinetic lenses 702 configured such that gas particles originating in the main-field deflection area 710 are reflected towards the gas detector inflow opening 714, significantly improving gas detector 106 collection efficiency and specificity (thus improving, e.g., sensitivity and signal to noise ratio of gas spectrometer measurement and analysis).

Figure 7E:
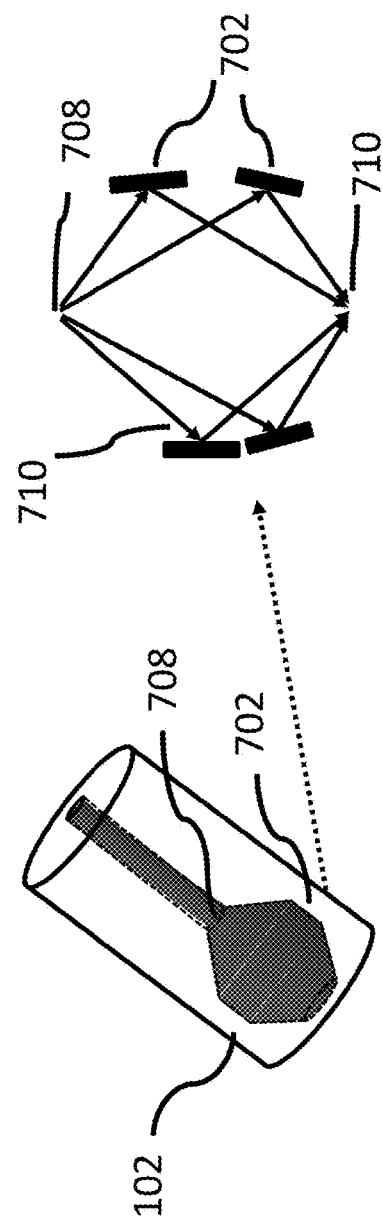
FIG. 7E schematically shows an example of a gas injector with a kinetic lens.

FIG. 7E shows an example of a gas injector 102 or gas detector 106 with a kinetic lens 702. Approximations of a rotational ellipsoid can be made using flat and/or curved surfaces configured to reflect (at least some trajectories of) gas particles originating at one (approximate) focus towards the other (approximate) focus.

FIG. 8 schematically shows an example of a photon injector 104 and a photon detector 108 mounted on a charged particle beam column 206. Preferably, a photon injector 104 comprises a light source optically connected by an optical fiber to a (cylindrical) rod lens focused on the main-field deflection area 710; and a photon detector 108 comprises a light sensor optically connected by an optical fiber to a rod lens focused on the main-field deflection area 710.

Photon injectors 104 and photon detectors 108 can be used as discussed with respect to FIG. 1 above. Further, as shown in FIG. 8, a photon injector 104 and photon detector 108 pair can be arranged so that photons emitted by a photon injector 104 are reflected off the substrate 704 and collected by the paired photon detector 108. The photon injector 104 used for this purpose can be used specifically to provide photons for the photon detector 108 to perform, e.g., polarimetry, reflectometry or interferometry. Alternatively, the photon injector 104 can be dual-purpose, e.g., the detected photons can be IR photons emitted by the photon injector 104 for temperature control, or photons emitted to excite substrate surface 706 material electrons to facilitate a desired substrate surface 706 chemistry.

Injected photons can also be pulsed, e.g., to enable local temperature measurement, or optical emission spectroscopy of photons emitted by substrate surface 706 material, in between pulses.

A cooled substrate stage 404 (e.g., indirectly cooled by the chuck) can also be used to assist in increasing the adsorption rate of reactant and other process-critical gases on the substrate 704, and/or to keep the average temperature of the substrate approximately constant at a designated temperature (and that temperature can be modified locally by photon injectors 104). The average temperature of the substrate 704 can be monitored and controlled by a substrate temperature control 802.

Figure 9:
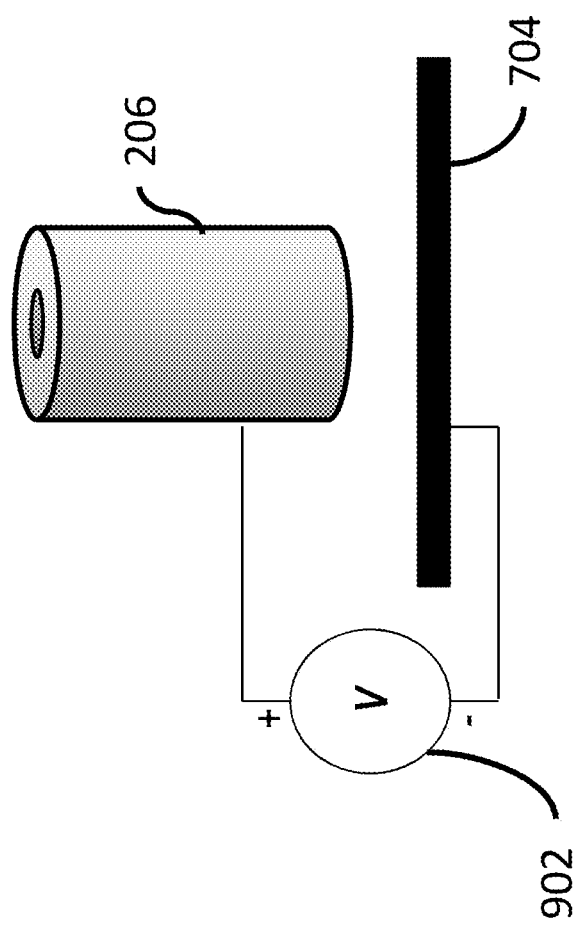
FIG. 9 schematically shows an example of a voltage bias applied between a charged particle beam column and a substrate.

FIG. 9 schematically shows an example of a voltage bias 902 applied between a charged particle beam column 206 and a substrate 704 to control charged particle impact over a wide range of energies.

Substrate electrical bias 902 can be used, along with control of beam energy at each column 206, to optimize the efficiency of charged-particle induced chemistry and/or physical effects. Preferably, beam energy is constant (or changes rarely).

FIG. 10 schematically shows an example of a charged particle beam column 206 configured for processes not using adsorbed gasses, e.g., charged particle beam material subtraction using milling, or direct modification using direct (not knock-on) ion beam implantation. In some such embodiments, a column 206 comprises: a charged particle beam gun 110 (an ion gun or electron beam gun), including a charged particle source (an ion or electron source, respectively), aperture and electrostatic lens; a deflection assembly 112 for blanking the charged particle beam 204, deflecting the charged particle beam trajectory, and/or modifying the charged particle beam shape (blanking, deflecting or reshaping the ion or electron beam 204, respectively); a main lens 114, for focusing the charged particle beam 204 (ion or electron beam) or adjusting the beam size at the substrate plane; one or more local photon injectors 104; a local gas detector 106; one or more local photon detectors 108; and an electron detector 116 (which can be located near the substrate 704 or inside the column 206).

As will be understood by one of ordinary skill in the arts of charged particle beam substrate processing, focus areas described in this application of gas and photon injectors and detectors 102, 104, 106, 108 (typically, the main-field deflection area 710) are approximate; that is, they comprise the described area, within (plus or minus) the range or error allowed by the particular process (and/or application) performed by the corresponding column 206, such that the desired function, effect and/or accuracy of that process (and/or application) are preserved.

According to some but not necessarily all embodiments, there is provided: A method of writing pattern on a substrate using multiple charged particle beam columns, individual columns projecting individual beams, comprising: targeting the substrate using multiple beams to perform multiple material processes comprising at least two of: removing substrate surface material, depositing material onto the substrate surface, and implanting ions comprising the implanting beam or an adsorbed gas; and injecting at least one gas, using local gas injectors, onto frames of the substrate corresponding to the beams, wherein said gas is selected to enable and/or to improve the rate and/or efficiency of ones of said material processes; wherein said material processes and said injecting are performed differently and independently by different ones of the columns, in a shared vacuum space and without transferring the substrate out of said vacuum space.

According to some but not necessarily all embodiments, there is provided: A method of writing pattern on a substrate using multiple charged particle beam columns, individual columns projecting individual beams, comprising: targeting the substrate using multiple beams to perform at least two material processes with different process chemistries, comprising at least one selection from: removing substrate surface material, depositing material onto the substrate surface, and implanting ions comprising an adsorbed gas; and injecting at least two gasses, using local gas injectors, onto frames of the substrate corresponding to the beams, wherein said gas is selected to enable and/or to improve the rate and/or efficiency of ones of said material processes, different ones of said material processes using at least one different one of said gasses; wherein said material processes and said injecting are performed differently and independently by different ones of the columns, in a shared vacuum space and without transferring the substrate out of said vacuum space.

According to some but not necessarily all embodiments, there is provided: A method of writing and inspecting pattern on a substrate using multiple charged particle beam columns, individual columns projecting individual beams, comprising: targeting the substrate, using the beams, to perform a material process comprising at least one of: removing substrate surface material, depositing new material onto the substrate surface, and implanting ions comprising the implanting beam or an adsorbed gas; injecting at least one gas, using local gas injectors, onto frames of the substrate corresponding to the beams, wherein said gas is selected to enable and/or to improve the rate and/or efficiency of said removing, said depositing or said implanting; and imaging the substrate, using the beams, to perform an inspection process comprising at least one of: critical dimension metrology, pattern registration, and imaging for defect identification; wherein said targeting and said imaging are performed differently and independently by different ones of the columns, in a shared vacuum space and without transferring the substrate out of said vacuum space.

According to some but not necessarily all embodiments, there is provided: A method for writing pattern on a substrate using multiple charged particle beam columns, individual columns projecting individual beams, comprising the actions of: a) writing multiple previous-layer features on the substrate surface using the beams; b) imaging, using the beams, one or more previous-layer features that are uncovered on the substrate surface, and calculating beam offsets and/or beam parameters in dependence on said imaging; and c) writing multiple new-layer features on the substrate surface in the same frames as said imaged previous-layer features, said writing performed using the beams, said beams controlled using said calculated offsets and/or parameters; wherein steps a), b) and c) are performed in a shared vacuum space and without transferring the substrate out of said vacuum space.

According to some but not necessarily all embodiments, there is provided: A method for writing pattern on a substrate using multiple charged particle beam columns, individual columns projecting individual beams, comprising the actions of: etching features on the substrate using the beams; imaging said features using the beams and calculating beam offsets in at least partial dependence on said imaging; depositing at least one material within and localized to said etched features using the beams and local gas injectors local to columns corresponding to ones of the beams, said depositing beams being targeted using said offsets; wherein said etching and said depositing are performed in a shared vacuum space and without transferring the substrate out of said vacuum space.

According to some but not necessarily all embodiments, there is provided: A charged particle beam tool, comprising: multiple charged particle beam columns, individual ones of said columns configured to produce an individual charged particle beam, said columns configured to perform at least two processes comprising at least two different selections from: removing substrate surface material, depositing material onto the substrate surface, and implanting ions comprising the implanting beam or an adsorbed gas; multiple local gas injectors local to corresponding ones of said columns and configured to inject onto corresponding frames at least one gas selected to enable and/or improve the rate and/or efficiency of at least one of said processes; a shared vacuum space within which said columns and said local gas injectors are located; and one or more column controllers storing instructions in a nontransitory medium that, when executed, cause said column controller to: control said beams to target the substrate to perform said processes, and control said local gas injectors to inject said gas onto said frames in support of one or more of said processes performed by said target action, said columns and said local gas injectors controlled to perform multiple ones of said processes differently and independently and without the substrate being transferred out of said shared vacuum space.

According to some but not necessarily all embodiments, there is provided: A charged particle beam tool, comprising: multiple charged particle beam columns, individual ones of said columns configured to produce an individual charged particle beam, said columns configured to perform at least two processes using different gas chemistries comprising at least one selection from: removing substrate surface material, depositing material onto the substrate surface, and implanting ions comprising the implanting beam or an adsorbed gas; multiple local gas injectors local to corresponding ones of said columns and configured to inject onto corresponding frames at least one gas selected to enable and/or improve the rate and/or efficiency of said processes; a shared vacuum space within which said columns and said local gas injectors are located; and one or more column controllers storing instructions in a nontransitory medium that, when executed, cause said column controller to: control said beams to target the substrate to perform said processes, and control said local gas injectors to inject said gas onto said frames in support of said processes performed by said target action, said columns and said local gas injectors controlled to perform multiple ones of said processes differently and independently and without the substrate being transferred out of said shared vacuum space.

According to some but not necessarily all embodiments, there is provided: A charged particle beam tool, comprising: multiple charged particle beam columns, individual ones of said columns configured to produce an individual charged particle beam, said columns configured to image the substrate and/or to perform at least one material process comprising at least one of: removing substrate surface material, depositing material onto the substrate surface, and implanting ions comprising the implanting beam or an adsorbed gas; multiple local gas injectors local to corresponding ones of said columns and configured to inject onto corresponding frames at least one gas selected to enable and/or improve the rate and/or efficiency of said material process; a shared vacuum space within which said columns and said local gas injectors are located; and one or more column controllers storing instructions in a nontransitory medium that, when executed, control said column controllers to: control said beams to target the substrate to perform said material process, control said local gas injectors to inject said gas onto said frames in support of said material process performed by said target action, and control said beams to image the substrate to perform an inspection process comprising at least one of: critical dimension metrology, pattern registration, and imaging for defect identification; wherein said column controllers are configured to control said columns and said local gas injectors to perform said material and inspection processes differently and independently and without the substrate being transferred out of said shared vacuum space.

According to some but not necessarily all embodiments, there is provided: A charged particle beam tool, comprising: multiple charged particle beam columns, individual ones of said columns configured to produce an individual charged particle beam, said columns configured to write features to and/or image the substrate; a shared vacuum space within which said columns are located; and one or more column controllers storing instructions in a nontransitory medium that, when executed, cause said column controllers to: control said beams to write multiple previous-layer features on the substrate, control said beams to image said previous-layer features, calculate beam offsets and/or beam parameters in dependence on said image action, and control said beams, using said calculated offsets and/or parameters, to write multiple new-layer features on the substrate; wherein said column controllers are configured to control said columns to perform said previous-layer write action and said new-layer write action differently and independently and without the substrate being transferred out of said shared vacuum space.

According to some but not necessarily all embodiments, there is provided: A charged particle beam tool, comprising: multiple charged particle beam columns, individual ones of said columns configured to produce an individual charged particle beam, said columns configured to write features to and/or image the substrate; multiple local gas injectors local to corresponding ones of said columns and configured to inject onto corresponding frames at least one gas selected to enable deposition of material on the substrate; and a shared vacuum space within which said columns and said local gas injectors are located; one or more column controllers storing instructions in a nontransitory medium that, when executed, cause said column controllers to: control said beams to etch features on the substrate, control said beams to image said etched features using the beams, calculate beam offsets in at least partial dependence on said imaging, and control said beams and said local gas injectors to deposit at least one material within and localized to said etched features, said beams being targeted using said offsets; wherein said column controllers are configured to control said columns and said local gas injectors to perform said etch action and said deposit action differently and independently and without the substrate being transferred out of said shared vacuum space.

According to some but not necessarily all embodiments, there is provided: Methods, tools and systems for patterning of substrates using charged particle beams without photomasks, without a resist layer, using multiple different processes (different chemistry processes and/or different ones of material deposition, removal and/or modification) in the same vacuum space, wherein said processes are performed independently (without cross-interference) and simultaneously. As a result, the number of process steps can be reduced and some lithography steps can be eliminated, reducing manufacturing cycle time and increasing yield by lowering the probability of defect introduction. Also, because such processes are resist-less, layer-to-layer registration and other column control processes can be performed by imaging previous-layer features local to (or in contact with) features to be written in a next layer as designated by the design layout database.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some embodiments, individual columns 206 can be configured to perform multiple different direct material processes in the same pass; preferably, a column 206 so configured performs direct material processes serially to prevent cross-interference between the different processes. In some embodiments, multiple different direct material processes using multiple different chemistries are performed by an individual column 206 in a single pass, with more than one different set of one or more local gas injectors 102 (per set) simultaneously local to that column 206. In some embodiments, a column 206 can be configured to perform multiple different direct material processes in the same frame 710 or the same stripe. In some embodiments, serial performance comprises waiting between performance of different processes for partial pressure(s) of incompatible process chemistries in the volume near the frame 710 to return to (or near) ambient partial pressure, or for other process-specific conditions to dissipate. Waiting time can be, for example, predetermined, or dependent on use of a local gas detector 106 to measure process-related gas pressure or on use of another local (or other) detector.

In some embodiments, beams image dedicated fiducial marks (e.g., Hadamard targets) for purposes of registration and alignment. In some embodiments, beams image dedicated critical dimension targets for purposes of critical dimension control.

In some embodiments, different gas injectors means different number and/or placement thereof and/or different chemistry(ies) injected thereby; different photon injectors means different number and/or placement thereof and/or different wavelength(s) photons injected thereby; and different gas or photon detectors means different number and/or placement thereof.

In some embodiments, filled 614 or partially filled 616 structures can be manufactured by a multi-process beam system 400 or multi-process cluster tool 500 in one pass: for example, embodiments in which arrays contain differently-configured columns corresponding to direct material addition and subtraction; or embodiments in which individual columns are configured to serially perform both direct material addition and subtraction.

In some embodiments, an array 402 can perform p-type doping and n-type doping at the same time (using different columns 206). In some embodiments, different columns 206 dope different substrate surface 706 locations and/or different substrate surface 706 depths differently. For example, a relatively highly doped p-type region can be created in one location, and a shallower, lightly doped drain can be created in a different location, in a single pass and without masks; or a highly doped region can be created above and/or surrounded by a lightly doped region, in a single pass and without masks.

In some embodiments, a recipe database can designate process recipes per-column 206, per-array 402 or other grouping of columns 206 within a multi-process beam system 400 or cluster tool 500.

In some embodiments, multiple features, targets, functional features or circuit structures are used for a given iteration by a column of registration, critical dimension control, updating the field model, or other beam control or other metrology process(es); per-stripe, per-frame, per-sub-frame, or per-other portion of a writing area 202 or of the substrate surface 706.

Those of ordinary skill in the arts of charged particle beam substrate processing will understand that while particular sequences of steps have been described herein with respect to various direct material processing applications, other sequences of steps can be performed to effect such applications, and other applications can be advantageously performed using direct material processing as disclosed. It will also be understood that processes described as being performed in a single pass can be performed in multiple passes.

Particular parameters and configuration options have been described herein for unit processes and recipes. Those of ordinary skill in the arts of charged particle beam substrate processing will understand that additional parameters and configuration options are available, and different allocations of parameters and configuration options between the process library and recipe levels of specification can be implemented.

In some embodiments, a cluster tool 500 can comprise (e.g., be partitioned into) more than one vacuum space, and groups of arrays 402, individual arrays 402 or individual columns 206 configured to perform multiple direct material processes share and simultaneously perform said different processes within ones of said vacuum spaces (shared vacuum spaces).

In some embodiments, minimal cross-interference between different processes in the same vacuum space can be tolerated for independent processing by different columns 206 and/or different arrays 402, to the extent such cross-interference is not significantly yield-reducing.

In some embodiments, valves are located between different arrays 402 (e.g., between different modules in a cluster tool 500), such that closing valves prevents process-related particles from travelling between said different arrays or into the wafer transport system 506. Such valves can be closed, e.g., while different arrays 402 are simultaneously processing substrates 704 to prevent cross-leakage of process gasses between the different arrays 402, or during servicing. Valve closure during simultaneous processing is not considered to break the shared nature of the vacuum space; because, for example, different substrates 704 generally remain in high vacuum throughout processing, and valves can be rapidly reopened after processing (e.g., to allow transferring the substrate 704 between modules), requiring little or no additional pump overhead, with minimal (or no) directly consequent risk of defect introduction.

In some embodiments, direct material processing can be performed on a resist layer, and/or to complement processing using a resist layer.

In some embodiments, direct inspection used to directly image functional or other features for purposes of control and metrology processes as discussed with respect to FIG. 5B can be performed on features written using a resist layer after said resist layer has been removed.

In some embodiments, multiple columns 206 are configured to pattern and/or inspect an individual writing area during a single pass.

In some embodiments, writing areas are configured to overlap, e.g., for inter-column 206 registration or to ensure irradiation of borders of writing areas.

Additional general background, which helps to show variations and implementations, may be found in the following publications, all of which are hereby incorporated by reference: Cornelius Thiele, et al., "Electron-beam-induced direct etching of graphene", Carbon, vol. 64, 84 (2013); Ivo Utke, et al., "Gas-assisted focused electron beam induced processing and fabrication", J. Vac. Sci. Technol. B 26, 1197 (2008); P. Roediger, et al., "Focused electron beam induced etching of silicon using chlorine", Nanotechnology 21 285306 (2010); H. Henry Yue, et al., "Plasma etching endpoint detection using multiple wavelengths for small open-area wafers", J. Vac. Sci. Technol. A 19, 66 (2001); http://www.ece.umd.edu/class/enee416/GroupActivities/Damascene %20Presentation.pdf (accessed Jun. 9, 2015); and Michael Huth, et al., "Focused electron beam induced deposition: A perspective", Beilstein J. Nanotechnol., August 2012, 3, 597-619; N. Chekurov, et al., "Dry fabrication of microdevices by the combination of focused ion beam and cryogenic deep reactive ion etching", J. Micromech. Microeng. 20, 085009 (2010); Riika Puurunen, "Surface chemistry of atomic layer deposition: a case study for the trimethylaluminum/water process", J. App. Phys. 97, 121301 (2005); Steven M. George, "Atomic Layer Deposition: An Overview", Chem. Rev. (2010), 110(1), 111-31; I. P. Jain, et al., "Ion beam induced surface and interface engineering", Surface Sci. Rep. 66 (2011), 77-172; O. D. Roshchupkina et al., "Focused ion beam induced structural modifications in thin magnetic films", J. App. Phys. 112, 033901 (2012); Yutaka Yamada, et al., "Tuning Surface Wettability at the Submicron-Scale: Effect of Focused Ion Beam Irradiation on a Self-Assembled Monolayer", J. Phys. Chem. C (December 2015), DOI: 10.1021/acs.jpcc.5b09019; U.S. Pat. No. 6,355,994; U.S. Pat. No. 6,617,587; U.S. Pat. No. 6,734,428; U.S. Pat. No. 6,738,506; U.S. Pat. No. 6,777,675; U.S. Pat. No. 6,844,550; U.S. Pat. No. 6,872,958; U.S. Pat. No. 6,943,351; U.S. Pat. No. 6,977,375; U.S. Pat. No. 7,122,795; U.S. Pat. No. 7,227,142; U.S. Pat. No. 7,435,956; U.S. Pat. No. 7,456,402; U.S. Pat. No. 7,462,848; U.S. Pat. No. 7,786,454; U.S. Pat. No. 7,928,404; U.S. Pat. No. 7,941,237; U.S. Pat. No. 8,242,457; U.S. Pat. No. 8,384,048; U.S. Pat. No. 8,999,627; U.S. Pat. No. 8,999,628; U.S. Pat. No. 9,184,027; and U.S. Pat. No. 9,207,539.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. patent application Ser. No. 14/085,768; U.S. patent application Ser. No. 14/703,306; U.S. patent application Ser. No. 14/522,563; U.S. patent application Ser. No. 14/523,909; U.S. patent application Ser. No. 14/694,710; U.S. patent application Ser. No. 14/695,767; U.S. patent application Ser. No. 14/695,776; U.S. patent application Ser. No. 14/695,785; U.S. patent application Ser. No. 14/745,463; U.S. patent application Ser. No. 14/809,985; U.S. patent application Ser. No. 14/966,165; and U.S. patent application Ser. No. 14/980,884.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method of writing pattern on a substrate using multiple charged particle beam columns, individual columns projecting individual beams, comprising:

targeting the substrate using multiple beams to perform multiple material processes comprising at least two of: removing substrate surface material, depositing material onto the substrate surface, and implanting ions comprising the implanting beam or an adsorbed gas; and injecting at least one gas, using local gas injectors, onto frames of the substrate corresponding to the beams, wherein said gas is selected to enable and/or to improve the rate and/or efficiency of ones of said material processes;

wherein said material processes and said injecting are performed differently and independently by different ones of the columns, in a shared vacuum space and without transferring the substrate out of said vacuum space.

2. The method of claim 1, wherein different ones of said material processes are respectively performed by different arrays of columns within said shared vacuum space.

3. The method of claim 1, wherein the columns performing said material processes are substantially the same.

4. The method of claim 1, wherein different ones of said material processes are performed by an individual array of columns.

5. The method of claim 1, wherein different ones of said material processes are performed serially by an individual column.

6. The method of claim 1, wherein at least one layer of pattern is written without removing the substrate from said shared vacuum space.

7. The method of claim 1, wherein said depositing and said injecting comprise atomic layer deposition, and/or wherein said removing and said injecting comprise atomic layer etch.

8. The method of claim 1, wherein said injecting injects at least two different gasses comprising at least two different process chemistries, different process chemistries being used by different ones of said material processes.

9. The method of claim 1, wherein said targeting is performed in direct dependence on the design layout database.

10. The method of claim 1, wherein said multiple different ones of said material processes are performed simultaneously.

11. A method of writing pattern on a substrate using multiple charged particle beam columns, individual columns projecting individual beams, comprising:

targeting the substrate using multiple beams to perform at least two material processes with different process chemistries, comprising at least one selection from: removing substrate surface material, depositing material onto the substrate surface, and implanting ions comprising an adsorbed gas; and injecting at least two gasses, using local gas injectors, onto frames of the substrate corresponding to the beams, wherein said gas is selected to enable and/or to improve the rate and/or efficiency of ones of said material processes, different ones of said material processes using at least one different one of said gasses;

wherein said material processes and said injecting are performed differently and independently by different ones of the columns, in a shared vacuum space and without transferring the substrate out of said vacuum space.

12. The method of claim 11, wherein different ones of said material processes are respectively performed by different arrays of columns within said shared vacuum space.

13. The method of claim 11, wherein the columns performing said material processes, and to which said gas injectors are local, are substantially the same.

14. The method of claim 11, wherein different ones of said material processes are performed by an array of columns.

15. The method of claim 11, wherein different ones of said material processes are performed serially by a column.

16. The method of claim 11, wherein at least one layer of pattern is written without removing the substrate from said shared vacuum space.

17. The method of claim 11, wherein said depositing and said injecting comprise atomic layer deposition, and/or wherein said removing and said injecting comprise atomic layer etch.

18. The method of claim 11, wherein said material processes comprise at least two selections from: said removing, said depositing and said implanting.

19. The method of claim 11, wherein said targeting is performed in direct dependence on the design layout database.

20. The method of claim 11, wherein said multiple different ones of said material processes with different process chemistries are performed simultaneously.

21. A method of writing and inspecting pattern on a substrate using multiple charged particle beam columns, individual columns projecting individual beams, comprising:

targeting the substrate, using the beams, to perform a material process comprising at least one of: removing substrate surface material, depositing new material onto the substrate surface, and implanting ions comprising the implanting beam or an adsorbed gas;

injecting at least one gas, using local gas injectors, onto frames of the substrate corresponding to the beams, wherein said gas is selected to enable and/or to improve the rate and/or efficiency of said removing, said depositing or said implanting; and imaging the substrate, using the beams, to perform an inspection process comprising at least one of: critical dimension metrology, pattern registration, and imaging for defect identification;

wherein said targeting and said imaging are performed differently and independently by different ones of the columns, in a shared vacuum space and without transferring the substrate out of said vacuum space.

22. The method of claim 21, wherein said targeting and said imaging are respectively performed by different arrays of columns within said shared vacuum space.

23. The method of claim 21, wherein the columns performing said material processes, and to which said gas injectors are local, are substantially the same.

24. The method of claim 21, wherein said targeting and said imaging are performed by an array of columns.

25. The method of claim 21, wherein said targeting and said imaging are performed by a column.

26. The method of claim 21, wherein at least one layer of pattern is written without removing the substrate from said shared vacuum space.

27. The method of claim 21, wherein said depositing and said injecting comprise atomic layer deposition, and/or wherein said removing and said injecting comprise atomic layer etch.

28. The method of claim 21, wherein said targeting and said imaging are performed in direct dependence on the design layout database.

29. The method of claim 21, wherein said targeting, said injecting and said imaging are performed simultaneously.

* * * * *